United States Patent
Narute et al.

(10) Patent No.: US 11,932,542 B2
(45) Date of Patent: Mar. 19, 2024

(54) WRINKLED GRAPHENE SUBSTRATE AND METHOD FOR MANUFACTURING THE SAME

(71) Applicant: KOREA RESEARCH INSTITUTE OF STANDARDS AND SCIENCE, Daejeon (KR)

(72) Inventors: Prashant Narute, Daejeon (KR); Seong-Gu Hong, Daejeon (KR)

(73) Assignee: KOREA RESEARCH INSTITUTE OF STANDARDS AND SCIENCE, Daejeon (KR)

( * ) Notice: Subject to any disclaimer, the term of this patent is extended or adjusted under 35 U.S.C. 154(b) by 106 days.

(21) Appl. No.: 17/649,092

(22) Filed: Jan. 27, 2022

(65) Prior Publication Data

US 2022/0242736 A1    Aug. 4, 2022

(30) Foreign Application Priority Data

Feb. 3, 2021   (KR) ........................ 10-2021-0015559

(51) Int. Cl.
*B29C 59/18*    (2006.01)
*B29C 61/02*    (2006.01)
(Continued)

(52) U.S. Cl.
CPC .......... *C01B 32/194* (2017.08); *B29C 59/18* (2013.01); *B29C 61/02* (2013.01);
(Continued)

(58) Field of Classification Search
CPC ........ B29C 2043/025; B29C 2043/186; B29C 2043/189; B29C 2043/3205; B29C 59/18;
(Continued)

(56) References Cited

U.S. PATENT DOCUMENTS

| 8,992,807 B2 | 3/2015 | Kim et al. |
| 2015/0340436 A1* | 11/2015 | Nam ................. H01L 29/78681 257/29 |

(Continued)

FOREIGN PATENT DOCUMENTS

| KR | 10-2011-0083546 A | 7/2011 |
| KR | 10-2013-0016846 A | 2/2013 |

(Continued)

OTHER PUBLICATIONS

Chen et al., "Fabrication of wrinkled graphene based on thermal-enhanced Rayleigh-Bénard convection for field electron emission", Carbon 129, 646-652 (2018).

(Continued)

*Primary Examiner* — Michael A Tolin
(74) *Attorney, Agent, or Firm* — Finch & Maloney PLLC

(57) ABSTRACT

A large-area wrinkled graphene substrate capable of being manufactured in a large-area, and a method for manufacturing the same is provided. A method for manufacturing a wrinkled graphene substrate includes: i) providing a graphene unit; ii) inserting a carrier film and a graphene unit between a pair of rolls and rotating the pair of rolls in opposite directions to attach a carrier film on the graphene unit, iii) immersing the graphene unit in an etching solution to provide graphene, iv) between a pair of rolls, graphene and poly(4-styrene sulfonic acid)/polystyrene (PSS/PS) substrate attaching graphene onto the PSS/PS substrate, v) attaching an ethylene vinyl acetate/polyethylene terephthalate (EVA/PET) substrate to wrinkled graphene on PSS/PS substrate by inserting EVA/PET and WGr/PSS/PS stack between the rolls, viii) removing the PSS/PS substrate by immersing PET/EVA/WGr/PSS/PS stack in water, and ix) providing a wrinkled graphene substrate on the EVA/PET substrate.

16 Claims, 23 Drawing Sheets

(51) Int. Cl.
  *B29C 65/00* (2006.01)
  *B32B 3/28* (2006.01)
  *B32B 9/00* (2006.01)
  *B32B 9/04* (2006.01)
  *B32B 27/28* (2006.01)
  *B32B 27/30* (2006.01)
  *B32B 27/36* (2006.01)
  *B32B 38/00* (2006.01)
  *B82Y 40/00* (2011.01)
  *C01B 32/194* (2017.01)
  *C23C 16/26* (2006.01)
  *H01B 5/14* (2006.01)
  *B29C 43/02* (2006.01)
  *H01B 1/04* (2006.01)

(52) U.S. Cl.
  CPC .......... *B29C 66/73715* (2013.01); *B32B 3/28* (2013.01); *B32B 9/007* (2013.01); *B32B 9/045* (2013.01); *B32B 27/281* (2013.01); *B32B 27/283* (2013.01); *B32B 27/306* (2013.01); *B32B 27/36* (2013.01); *B32B 38/004* (2013.01); *B82Y 40/00* (2013.01); *C23C 16/26* (2013.01); *B29C 2043/025* (2013.01); *B32B 2313/04* (2013.01); *H01B 1/04* (2013.01); *H01B 5/14* (2013.01)

(58) Field of Classification Search
  CPC ... B29C 61/003; B29C 61/02; B29C 65/4815; B29C 65/66; B29C 66/73715; B29C 66/83413; B32B 3/28; B32B 9/005; B32B 9/007; B32B 9/045; B32B 27/281; B32B 27/283; B32B 27/306; B32B 27/36; B32B 37/02; B32B 37/04; B32B 37/06; B32B 37/10; B32B 37/16; B32B 37/18; B32B 37/182; B32B 37/185; B32B 2037/1215; B32B 2037/1223; B32B 2037/268; B32B 38/0036; B32B 38/004; B32B 2038/0048; B32B 2309/02; B32B 2313/04; B32B 2331/04; B32B 2367/00; B32B 2383/00; B32B 2457/00; B82Y 30/00; B82Y 40/00; C01B 32/00; C01B 32/182; C01B 32/184; C01B 32/186; C01B 32/194; C01B 2204/02; C01B 2204/04; C01B 2204/20; C23C 16/26; H01B 1/04; H01B 5/14

See application file for complete search history.

(56) References Cited

U.S. PATENT DOCUMENTS

2019/0022975 A1\* 1/2019 Hurt ................. B32B 25/18
2019/0106326 A1  4/2019 Park et al.

FOREIGN PATENT DOCUMENTS

| KR | 10-1423037 B1 | 8/2014 |
| KR | 10-1754208 B1 | 7/2017 |
| KR | 10-2017-0140448 A | 12/2017 |
| KR | 2021008589 A * | 1/2021 |

OTHER PUBLICATIONS

Fu et al., "Strain dependent resistance in chemical vapor deposition grown graphene", Applied Physics Letters 99, 213107 (2011).
Gao et al., "Polymer Swelling Induced Conductive Wrinkles for an Ultrasensitive Pressure Sensor", ACS Macro Lett. 2016, 5, 823-827 (2016).
Hong et al., "Omnidirectionally Stretchable and Transparent Graphene Electrodes", ACS Nano 2016, 10, 9446-9455 (2016).
Kim et al., "Three-Dimensional Writing of Highly Stretchable Organic Nanowires", ACS Macro Letters 2012, 1, 375-379 (2012).
Lee et al., "Fracture mechanism and electromechanical behavior of chemical vapor deposited graphene on flexible substrate under tension", Carbon 118 (2017) 475-484 (2017).
Lee et al., "Multiscale, Hierarchical Patterning of Graphene by Conformal Wrinkling", Nano Lett. 2016, 16, 7121-7127 (2016).
Won et al., "Double-layer CVD graphene as stretchable transparent electrodes", Nanoscale, 2014, 6, 6057-6064 (2014).
Zang et al., "Multifunctionality and control of the crumpling and unfolding of large-area graphene", Nature Materials 12, 321-325 (2013).

\* cited by examiner

2L-WGr/PSS/PS

2L-WGr/EVA/PET

WRINKLED GRAPHENE SUBSTRATE AND METHOD FOR MANUFACTURING THE SAME

CROSS-REFERENCE TO RELATED APPLICATION

This application claims priority to and benefits of Korean Patent Application No. 10-2021-0015559, filed in the Korean Intellectual Property Office on Feb. 3, 2021, the entire amounts of which are incorporated herein by reference.

BACKGROUND

(a) Technical Field

The present invention relates to a wrinkled graphene substrate and a method for manufacturing the same. More specifically, the present invention relates to a wrinkled graphene substrate with low-cost and large-area using roll-to-roll processing, and a method for manufacturing the same.

(b) Description of the Related Art

Graphene is one of the allotropes of carbon and has a structure in which carbon atoms gather to form a two-dimensional plane. In graphene, each carbon atom forms a hexagonal lattice and is located at the vertices of hexagon. Graphene is a thin film with a thickness of one atom, that is, about 0.335 nm and has a good physical and chemical stability. Graphene conducts electricity 100 times better than copper and can move electrons 100 times faster than single crystal silicon which is mainly used as a semiconductor material. Ideally, the strength of single crystalline graphene is 200 times stronger than that of steel, and has high thermal conductivity and excellent elasticity, so that the graphene does not lose its electrical properties even stretched or bent.

However, chemical vapor deposited (CVD) graphene is a multicrystalline single-layer film, which is brittle and its electrical resistance increases when stretched. Therefore, the CVD graphene is artificially wrinkled to enhance its properties. Accordingly, various methods for preparing large-area wrinkled graphene have been developed.

The above information disclosed in this Background section is only for enhancement of understanding of the background of the invention, and therefore, it may contain information that does not form the prior art that is already known in this country to a person of ordinary skill in the art.

SUMMARY

A method for manufacturing a large-area wrinkled graphene substrate that can be manufactured with a low cost using a roll-to-roll process is provided. In addition, a wrinkled graphene manufactured by the above method is provided.

A method for manufacturing a wrinkled graphene substrate according to an embodiment of the present invention includes i) providing a (CVD graphene) graphene unit; ii) inserting a carrier film and the graphene unit between a pair of rolls and rotating the pair of rolls in opposite directions to attach the carrier film onto the graphene unit; iii) providing graphene by immersing the graphene unit in an etching solution; iv) inserting the graphene and poly(4-styrene sulfonic acid)/polystyrene (PSS/PS) substrate between the pair of rolls and attaching the graphene onto the PSS/PS substrate; v) removing the carrier film from the graphene/PSS/PS; vi) heating the graphene/PSS/PS stack wherein the PS substrate shrunken to generate the wrinkled graphene (WGr); vii) inserting a target polymeric substrate and WGr/PSS/PS between the pair of rolls, and transferring the WGr onto the target polymeric substrate by rotating the pair of rolls in opposite directions; viii) immersing the target polymeric substrate/WGr/PSS/PS stack in water to separate WGr from PS by dissolving PSS, and ix) providing a wrinkled graphene substrate on the target polymeric substrate.

In the providing the graphene unit, the graphene unit may include i) a first graphene layer; ii) a copper thin film located on the first graphene layer; and iii) a second graphene layer located on the copper thin film. The first and the second graphene layers grown by using the CVD method on copper thin film; copper thin film acts as a catalyst.

A method for manufacturing a multilayer wrinkled graphene substrate according to an embodiment of the present invention may further include repeating the attaching of graphene to the PSS/PS substrate and the removing the carrier film from the graphene before providing the wrinkled graphene. The graphene may be laminated in multiple layers through the attaching the graphene on the PSS/PS substrate. The attaching the graphene to the PSS/PS substrate and the removing the carrier film from the graphene may be repeated 2 to 4 times. The graphene may be stacked in two to four layers.

In the providing the graphene, the etching solution in one liter of deionized water include i) ammonium persulfate (APS) of greater than 0 and not more than 0.1M; ii) imidazole of 1 mM to 10 mM; and iii) 50 mM sulfuric acid.

In attaching the graphene on the PSS/PS substrate, the PSS/PS substrate include i) a PSS layer spin-coated on the graphene; and ii) a PS substrate attached on the PSS substrate. The PSS layer is dissolved in the water and the PS substrate is automatically separated from the graphene in immersing the PSS/PS substrate in water to remove. The PSS/PS substrate and graphene compressed by the pair of rotating rolls in attaching the graphene on the PSS/PS substrate. The amount of heat shrinkage of the PS substrate may be 10% to 900%. The attaching the graphene on the PSS/PS substrate performed at 80° C. to 120° C. Heating temperature of the graphene/PSS/PS may be not less than glass transition temperature of the PS substrate.

Heating temperature of the graphene/PSS/PS may be 120° C. to 150° C. in the providing the wrinkled graphene. The carrier film may be manufactured by coating silicone on a polyethylene terephthalate substrate in the inserting a carrier film and the graphene unit between a pair of rolls. The inserting a carrier film and the graphene unit between a pair of rolls may be performed at 20° C. to 30° C.

The target polymeric substrate may include at least one material selected from a group of an ethylene vinyl acetate/polyethylene terephthalate (EVA/PET), polyimide and ecoflex. The EVA in EVA/PET substrate may be melted to be compressed onto the wrinkled graphene at 85° C. to 120° C. in the transferring the wrinkled graphene onto EVA/PET substrate.

A method for manufacturing a wrinkled graphene substrate according to another embodiment of the present invention includes i) providing a graphene unit; ii) inserting a carrier film and the graphene unit between a pair of rolls and rotating the pair of rolls in opposite directions to attach the carrier film onto the graphene unit; iii) providing graphene by immersing the graphene unit in an etching solution; iv) inserting the graphene and poly(4-styrene sulfonic acid)/polystyrene PSS/PS substrate between the pair of rolls and attaching the graphene onto the PSS/PS substrate; v) removing the carrier film from the graphene; vi) heating the graphene/PSS/PS stack wherein the PS substrate shrunken to generate a wrinkled graphene; vi) coating polydimethylsiloxane (PDMS) on the WGr to transfer the WGr onto PDMS substrate; vii) immersing the PDMS/WGr/PSS/PS substrate in water to remove the PS substrate; and viii) providing a WGr substrate on which the WGr is transferred onto the PDMS.

The polydimethylsiloxane as a liquid may be coated on the WGr by drop casting in the coating polydimethylsiloxane.

A wrinkled graphene substrate according to another embodiment of the present invention is manufactured by the above-identified method. The average surface roughness of the wrinkled graphene may be 10 nm to 990 μm. The wrinkled graphene may have a structure in which wrinkles of tens of nanometers to several hundreds of micrometers are mixed in one-dimensional or two-dimensional manner.

A large-area wrinkled graphene having excellent mechanical, structural, electrical, optical, chemical stability and transferability can be manufactured by the roll-to-roll method. Especially, wrinkled graphene, in particular, has excellent mechanical stability against external force such as bending and torsion, and out-of-plane deformation due to induced compressive deformation. In particular, wrinkled graphene provides novel properties such as superior stretchability and specific surface area, that is, surface area per unit volume, controllable water wettability, optical properties and chemical reactivity compared to planar graphene. Here, stretchability refers to the ability of a conductive material to maintain electrical performance against mechanical deformation. In addition, by using a water soluble polymer (PSS) as an interface layer wrinkled graphene can be transferred without damaging the wrinkle structure. In addition, a large-area wrinkled graphene can be easily produced with low cost. The prepared wrinkled graphene has superior elasticity, specific surface area, wettability, engineered chemical reactivity, energy bandgap, surface wettability, plasmonic properties, energy storage, thermal diffusion modulation, optical transmittance and sheet resistance compared to planar graphene. In addition, these properties can be controlled by adjusting the wrinkled structure. As a result, the wrinkled graphene can be well-utilized in electronic devices such as sensors, mechanical devices including actuators, and optoelectronic application devices. In particular, it exhibits elasticity and flexibility due to the wrinkled structure thereof, and has excellent applicability because it can be manufactured by combining wrinkled graphene and a transparent flexible substrate.

DETAILED DESCRIPTION

Figure 1:
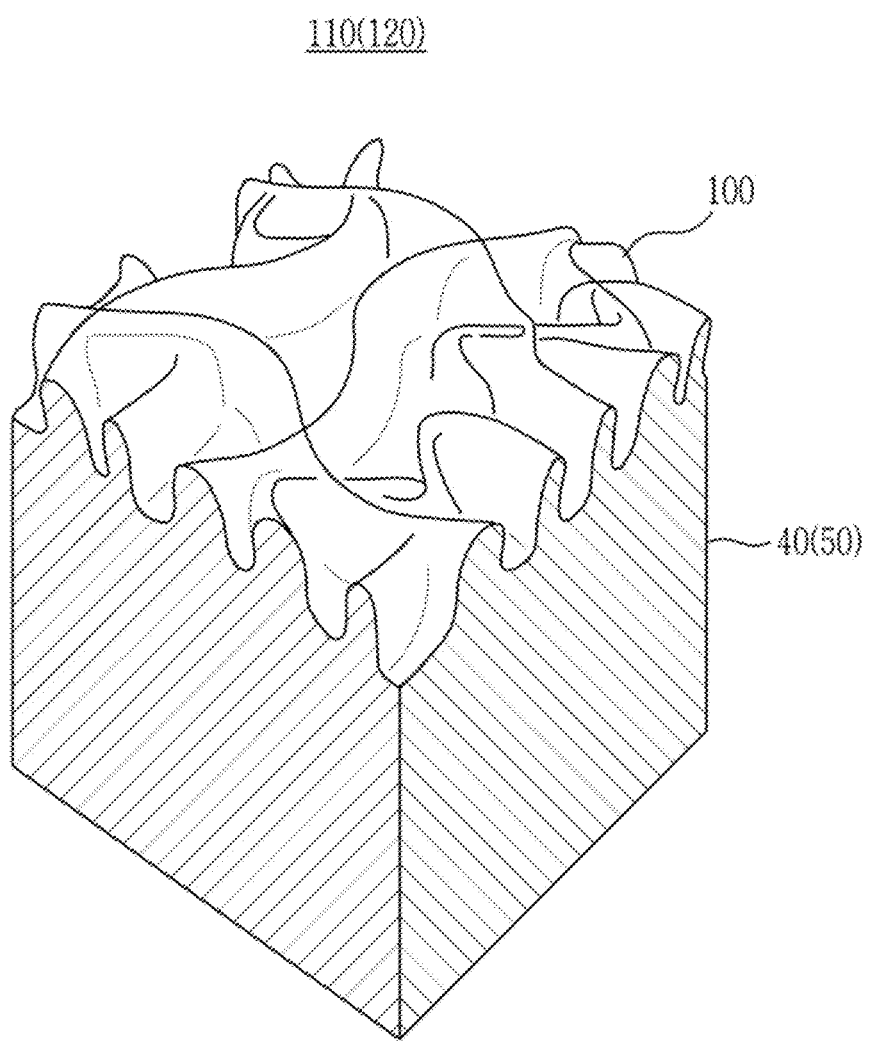
FIG. 1 is a schematic partial perspective view of a large-area wrinkled graphene substrate according to a first embodiment of the present invention.

Hereinafter, the present invention will be described more fully with reference to the accompanying drawings, in which exemplary embodiments of the invention are shown. As those skilled in the art would realize, the described embodiments may be modified in various different ways, all without departing from the spirit or scope of the present invention. Advantages and characteristics of the technical disclosure and methods for achieving them should become apparent with reference to exemplary embodiments described in detail below in addition to the accompanying drawings. However, the scope of the disclosure is not limited to the exemplary embodiments which will be described below, and may be implemented in various forms. Throughout the specification, like elements refer to like reference numerals. Detailed description of the well-known prior art is omitted.

It will be understood that, although the terms first, second, etc., may be used herein to describe various elements, these elements should not be limited by these terms. These terms are only used to distinguish one element from another. As used herein, the singular forms "a", "an", and "the" are intended to include the plural forms as well, unless the context clearly indicates otherwise. In addition, when a unit "comprises" an element, the unit does not exclude another element but may further include another element unless the context clearly indicates otherwise.

Hereinafter, embodiments of the present invention will be described in detail with reference to the accompanying drawings so that those skilled in the art can easily carry out the present invention. The present invention may, however, be embodied in many different forms and should not be construed as limited to the embodiments set forth herein.

FIG. 1 schematically shows a partial structure of wrinkled graphene substrates 110 and 120 according to an embodiment of the present invention. The wrinkled graphene substrates 110 and 120 of FIG. 1 are only for illustrating the present invention, and the present invention is not limited thereto. Therefore, the wrinkled graphene substrates 110 and 120 may be deformed into other shapes. The wrinkled graphene substrates 110 and 120 include each of the substrates 40 and 50 and the wrinkled graphene 100 formed thereon. The substrates 40 and 50 support the wrinkled graphene 100 while maintaining a shape of the wrinkled graphene 100.

In FIG. 1, the wrinkled graphene 100 has a structure in which a plurality of wrinkles are formed. In addition, the wrinkled graphene 100 may be manufactured in a large area by using a roll-to-roll process. The wrinkled graphene 100 has a structure in which wrinkles of tens of nanometers to several hundreds of micrometers are mixed in one-dimensional or two-dimensional manner.

The average surface roughness of the wrinkled graphene 100 is 10 nm to 990 μm. If the average surface roughness of the wrinkled graphene 100 is too small or too large, the wrinkle effect is insignificant. Therefore, the average surface roughness is adjusted within the above-mentioned range.

Figure 2:
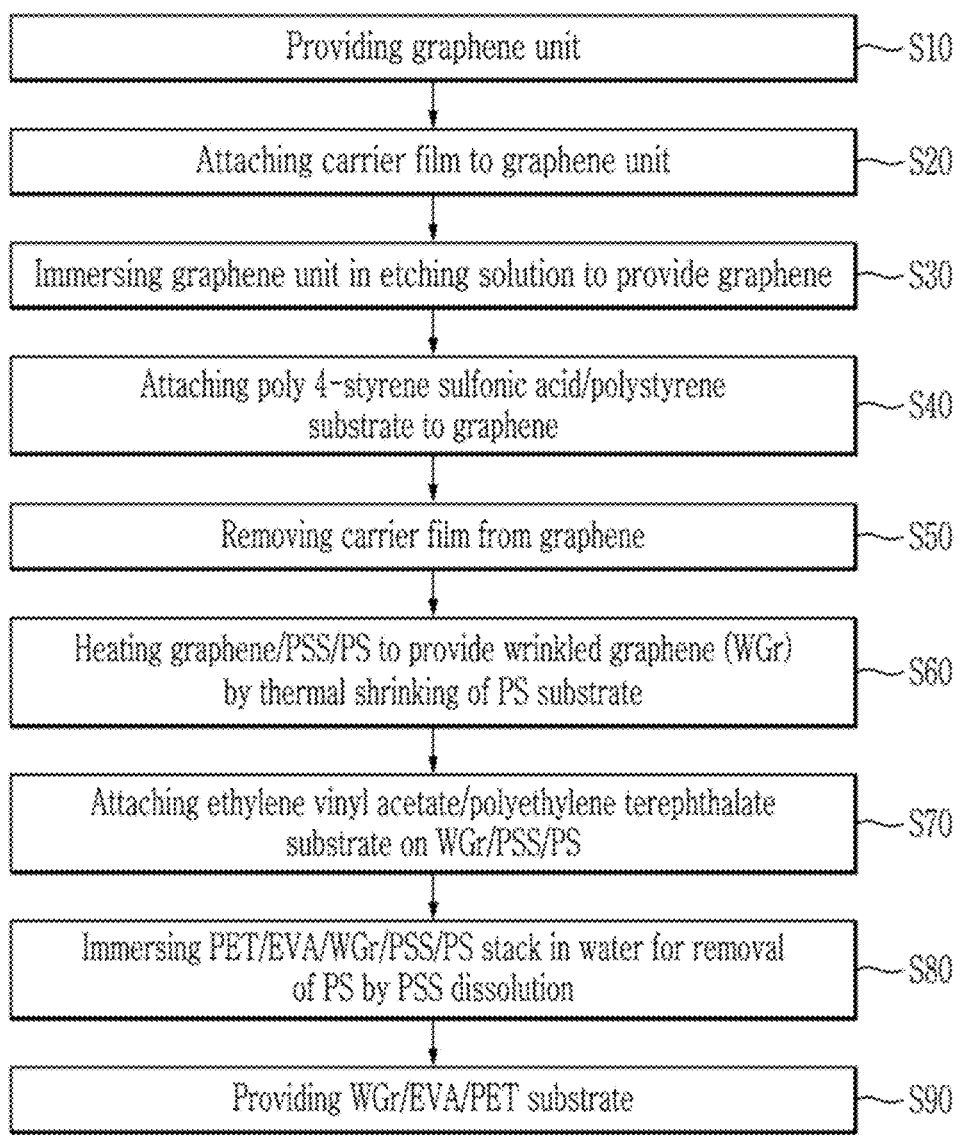
FIG. 2 is a schematic flowchart of a method for manufacturing a large-area wrinkled graphene substrate according to a first embodiment of the present invention.

FIG. 2 schematically shows a flowchart of a method for manufacturing a large-area wrinkled graphene substrate according to a first embodiment of the present invention. The method of manufacturing a large-area wrinkled graphene substrate of FIG. 2 is merely to illustrate the present invention, and the present invention is not limited thereto. Therefore, a method for manufacturing a large-area wrinkled graphene substrate can be modified in other forms.

Meanwhile, FIGS. 3 to 11 schematically show each step of the method of manufacturing the large-area wrinkled graphene substrate of FIG. 2. Hereinafter, each step of FIG. 2 will be described in detail with reference to FIGS. 3 to 11, respectively.

As shown in FIG. 2, the method for manufacturing a wrinkled graphene substrate includes providing steps of a graphene unit S10, attaching a carrier film to the graphene unit S20, immersing the graphene unit in an etching solution to provide a graphene S30, attaching the graphene to a poly 4-styrene sulfonic acid/polystyrene (PSS/PS) substrate S40, removing the carrier film from graphene/PSS/PS S50, heating the graphene/PSS/PS to provide a wrinkled graphene by heat shrinkage of PS substrate S60, attaching an ethylene vinyl acetate/polyethylene terephthalate (EVA/PET) substrate on the wrinkled graphene S70, immersing the EVA/PET/WGr/PSS/PS stack in water for removing PS substrate by dissolving PSS in water S80, and providing a wrinkled graphene substrate S90. In addition, the method of manufacturing a large-area wrinkled graphene substrate may further include other steps if necessary.

Figure 3:
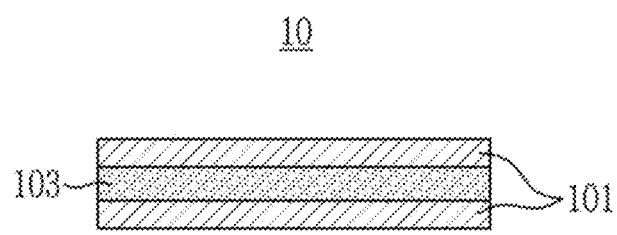
FIGS. 3 to 11 are views schematically illustrating each step of the method for manufacturing the large-area wrinkled graphene substrate of FIG. 2.

First, in the step S10 of FIG. 2, the graphene unit 10 is provided as shown in FIG. 3. The graphene unit 10 includes a first graphene 101, a copper thin film 103, and a second graphene 101. The structure of the graphene unit 10 of FIG. 3 is merely to illustrate the present invention, and the present invention is not limited thereto. Accordingly, the structure of the graphene unit 10 may be modified into other forms.

The graphene unit 10 of FIG. 3 is manufactured by chemical vapor deposition. That is, the first and second graphenes 101 and 101 are deposited on both sides of the copper thin film 103 as a substrate by a chemical vapor deposition, thereby the graphene unit 10 is manufactured. The first and second graphenes 101 are grown to be obtained from the copper thin film 103 functioning as a catalyst, respectively.

Figure 4:
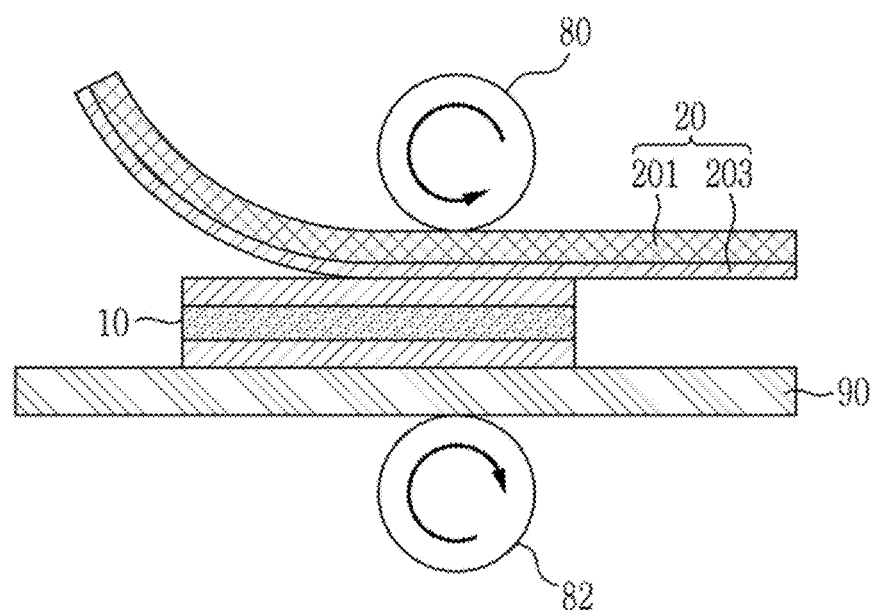

Returning to FIG. 2, in the step S20, the carrier film 20 is attached to the graphene unit 10 as shown in FIG. 4. That is, the carrier film 20 is attached to the graphene unit 10 while rotating the pair of rolls 80 and 82 in the direction of the arrow.

The carrier film 20 is manufactured by coating silicone 203 on a polyethylene terephthalate (PET) substrate 201 to improve adhesion. The thickness of the PET substrate 201 may be tens to hundreds of micrometers. By attaching the graphene unit 10 to the carrier film 20 including the PET substrate 201 having such a thickness, stable transportation and following processes can be performed.

That is, the graphene unit 10 cannot be handled by itself due to the thin thickness with one layer of carbon atoms, for example, about 0.335 nm. Therefore, in order to smoothly proceed with the roll-to-roll process, the process is carried out at 20° C. to 30° C. by pasting it on the carrier film 20 containing polyethylene terephthalate (PET), which serves to transport the graphene unit 10. Preferably, the process temperature may be 23° C. Since graphene has mechanically robust properties, it is suitable for applying a roll-to-roll process. Therefore, it is possible to manufacture large-area graphene using a roll-to-rule process.

Figure 5:
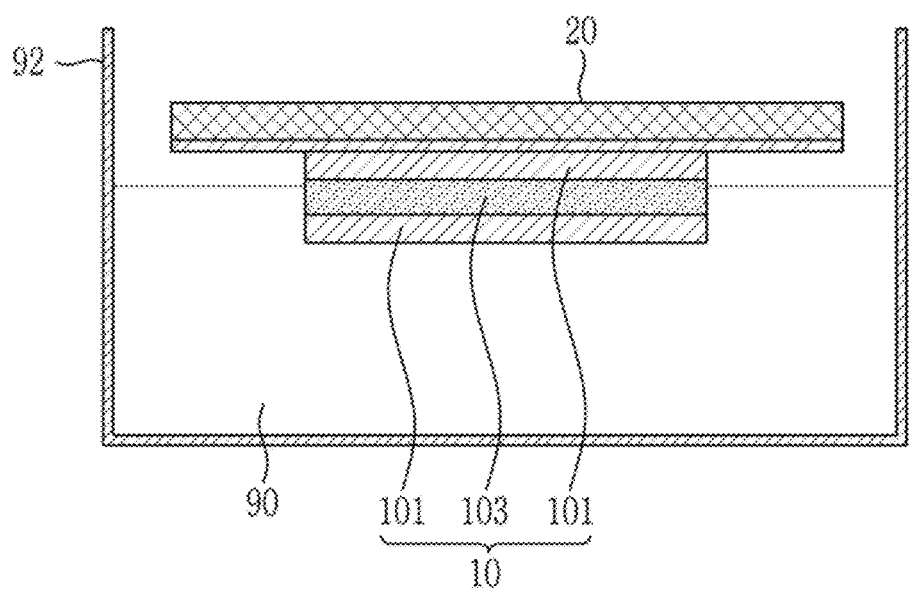

In the step S30 of FIG. 2, the graphene unit 10 is immersed in an etching solution to provide the graphene 101 as shown in FIG. 5. To this end, a container 92 containing the etching solution 90 is prepared. The etching solution of one liter of deionized water 90 includes ammonium persulfate (APS), imidazole, and sulfuric acid. For example, the concentration of APS is not greater than 0.1M, the concentration of imidazole is 1 mM to 10 mM, and the concentration of sulfuric acid may be 50 mM. Aqueous APS solution is suitable for removing the copper thin film 103 used for CVD graphene growth in the concentration range described above.

Figure 6:
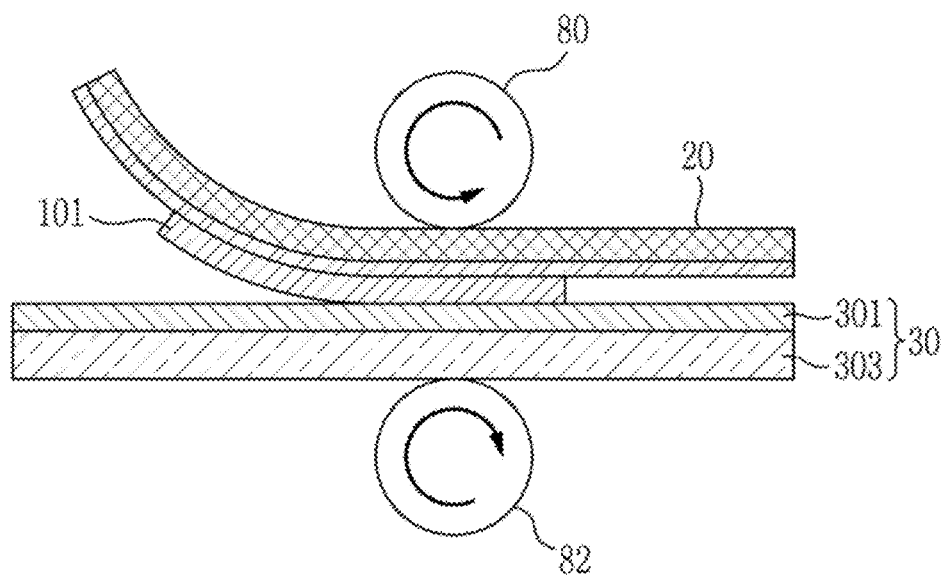

Doping is performed while etching the copper thin film 103 using the etching solution 90. Imidazole improves the electrical conductivity as well as the surface adhesion of the graphene. The enhanced surface adhesion of graphene enables the fabrication of multi-layered graphene. Referring to FIG. 2, in the step S40, a poly 4-styrene sulfonic acid/polystyrene (PSS/PS) substrate 30 is attached to the graphene 101 as shown in FIG. 6. That is, through a roll-to-roll process, the graphene 101 and the PSS/PS substrate 30 are inserted between the pair of rolls 80 and 82, and while rotating them in opposite direction, the graphene 101 is attached to the PSS/PS substrate 30 by using dry transfer method at 80° C. to 120° C., preferably at 100° C.

The PSS interface layer in the PSS/PS substrate 30 functions as a sacrificial layer. The PSS/PS substrate 30 includes a poly(4-styrene sulfonic acid) (PSS) coating 301 and a polystyrene (PS) substrate 303. The PSS/PS substrate 30 has a structure in which the PSS coating 301 is located on the PS substrate 303. Since the PSS coating 301 is water-soluble, it facilitates the transfer of wrinkled graphene. As a result, the polystyrene (PS) substrate 303 can be easily removed without using a water as solvent, and processability of the wrinkled graphene is improved. Heat shrinkage of the PSS/PS substrate 30 required in the following process for manufacturing the wrinkled graphene occurs due to heat shrinkage of the PS substrate 303. Therefore, the amount of heat shrinkage of the PS substrate 303 has a great influence on the determination of the wrinkled structure of the wrinkled graphene. During the heat treatment process of the PS substrate 303, the amount of heat shrinkage is determined by two factors.

First, the amount of pre-stretching added above the glass transition temperature during the manufacturing of the PS substrate 303 determines the maximum amount of heat shrinkage that can occur in the PS substrate 303 during the heat treatment. That is, the amount of linear tensile strain used in manufacturing the PS substrate 303 becomes the maximum amount of heat shrinkage that can occur during heat treatment. The amount of heat shrinkage ranges from several tens to several hundreds percent. More specifically, the amount of heat shrinkage may be 10% to 900%. If the amount of heat shrinkage is too small or too large, the effect as wrinkled graphene is insignificant. Therefore, the amount of heat shrinkage is adjusted in the above-mentioned range. By controlling the thickness of the PSS coating 301 and the amount of heat shrinkage of the PS substrate 303, wrinkles having a desired waveform and amplitude, that is, surface roughness, can be manufactured. Here, a wrinkled structure without overlapping or folding is manufactured using a transparent electrode as a target.

Second, it is possible to control the amount of heat shrinkage of the PS substrate 303 by controlling the heat treatment temperature and time in the heat treatment process for producing the wrinkled graphene. Therefore, the wrinkled graphene having a desired structure is manufactured by controlling the heat treatment process of the PS substrate 303 according to the purpose of use of the manufactured wrinkled graphene. The PSS substrate 301 serves as a skin layer for forming wrinkles on the graphene 101 while also functioning as a sacrificial layer during the transfer process. As a result, wrinkles are formed in the graphene 101. Meanwhile, since the PSS 301 coating is water-soluble, the poly 4-styrene sulfonic acid/polystyrene PSS/PS substrate 30 can be removed by being immersed in water after forming the wrinkled graphene by a roll-to-roll process in a following process.

Figure 7:
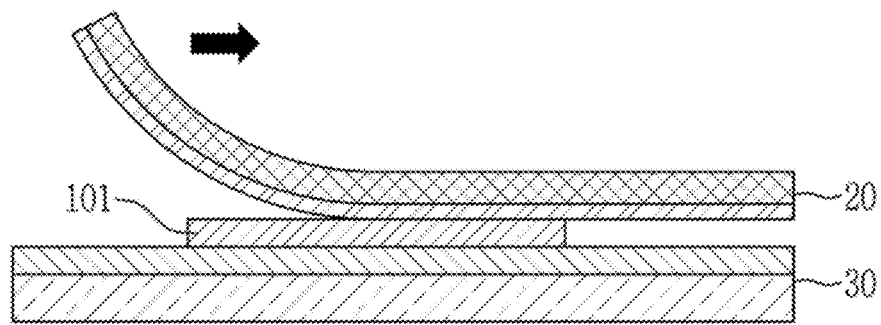

In step S50 of FIG. 2, the carrier film 20 is pulled out from the graphene 101 in the direction of the arrows shown in FIG. 7. That is, the carrier film is carefully peeled off from the graphene 101. Next, the process for producing wrinkled graphene is completed through thermal contraction by heating the graphene 101, the PSS coating 301, and the PS substrate 303.

Meanwhile, by repeating steps S40 and S50, graphene having a multilayer structure can be manufactured. That is, the graphene from which the carrier film 20 is removed in step S50 is sent back to step S40, and another carrier film to which another graphene is attached is used to combine graphenes. Two layers of graphene can be manufactured by laminating them to face each other. Then, the step S50 is performed again to remove the carrier film. By repeating this process, multilayer graphene with two or more layers can be prepared. More preferably, 2 to 4 layers of graphene may be manufactured by repeating steps S40 and S50 in 2 to 4 times. The multilayer graphene of this structure has slightly lower optical transmittance compared to single-layer graphene, but has excellent sheet resistance, stretchability, and durability.

Figure 8:
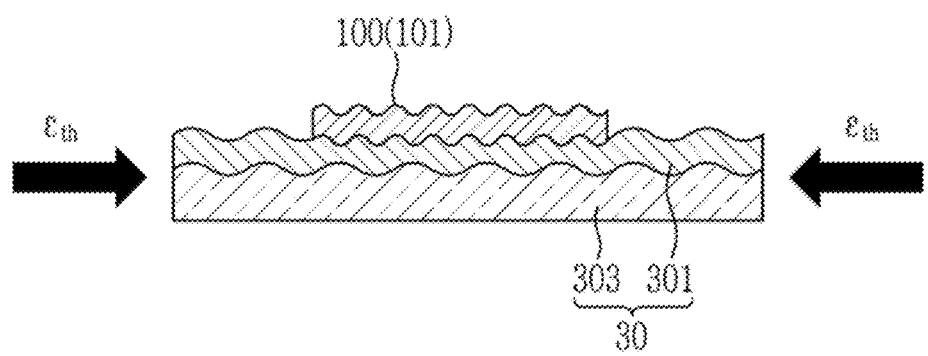

As shown in FIG. 2, in step S60, the wrinkled graphene 100 is provided through thermal contraction of the PS 303 substrate by heating the graphene 101, the PSS coating 301, and the PS substrate 303 as shown in FIG. 8. The heating temperature used in the heat treatment process for heat shrinkage may be above the glass transition temperature of the PS substrate 303. For example, the heating temperature may be 120° C. to 150° C. More preferably, the heating temperature may be 135° C. If the heating temperature is too low, thermal contraction of the PS substrate 303 may be small, and then wrinkles may not be well formed in the graphene 101. In addition, if the heating temperature is too high, thermal contraction of the PS 303 substrate occurs too quickly, thereby making it difficult to control the desired wrinkle structure in the graphene 101. Therefore, by adjusting the heating temperature and the heating time to the above-mentioned ranges, it is possible to prepare a wrinkled graphene 100 having a desired wrinkled structure, that is, a desired wavelength and amplitude.

As a result, the wrinkled graphene 100 with high sheet resistance and stretchability while maintaining proper optical transmittance by thermal contraction is manufactured. In particular, the PS substrate 303 is capable of thermally contracted in one direction or several directions. Therefore, by controlling the direction of heat shrinkage and the amount of heat shrinkage, it is possible to manufacture wrinkled graphene 100 having a complex wrinkled structure of one-dimensional, two-dimensional, or a mixture of both.

Figure 9:
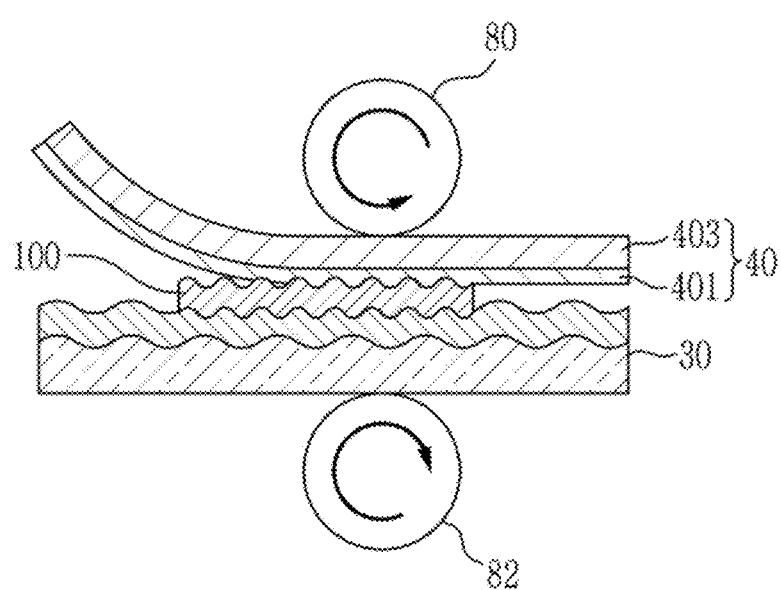

In step S70 of FIG. 2, an ethylene vinyl acetate/polyethylene terephthalate (EVA/PET) substrate 40 is attached on the wrinkled graphene 100 as shown in FIG. 9. That is, the EVA/PET substrate 40 is attached in order to impart mechanical rigidity to the wrinkled graphene 100. In a roll-to-roll process, the EVA/PET substrate 40, the wrinkled graphene 100 and the PSS/PS substrate 30 are inserted between the pair of rolls 80 and 82, and the pair of rolls 80 and 82 rotate in opposite directions in the direction of the arrow. As a result, the EVA/PET substrate 40 is attached on the wrinkled graphene 100.

The EVA/PET substrate 40 includes an EVA substrate 401 and a PET substrate 403. the EVA substrate 401 can melt on the wrinkled graphene 100 by adjusting transfer temperature to be in a range from 85° C. to 120° C. The molten liquid EVA substrate 401 penetrates between the wrinkled microstructures of the wrinkled graphene 100 and is firmly attached to the wrinkled graphene surface during curing, thereby improving the durability of the wrinkled graphene. If the transfer temperature is too low, the melting of the EVA substrate 401 may become non-uniform as a whole, so that the EVA substrate 401 may not be adhered well to the wrinkled graphene 100. Due to this, the wrinkled structure of the wrinkled graphene is not only changed but its durability is also reduced. On the contrary, if the transfer temperature is too high, the molten EVA substrate 401 loses its viscosity, and thus does not maintain adhesion with the wrinkled graphene 100 during curing and then flows down. In the above-described temperature range, the EVA substrate 401 is melted while having an appropriate viscosity uniformly over the entire surface, so that it is firmly attached to the wrinkled graphene 100.

The EVA/PET substrate 40 is a highly transparent and flexible polymer substrate. Therefore, the one-dimensional or two-dimensional wrinkle pattern of the wrinkled graphene 100 on it can be commercially utilized for the flexible transparent electrode. In addition, according to the purpose of use of the wrinkled graphene 100, it is possible to transfer to various polymer substrates such as polyimide (PI) and ecoflex substrate instead of the EVA/PET substrate 40, so the industrial use of wrinkled graphene 100 can be maximized.

Figure 10:
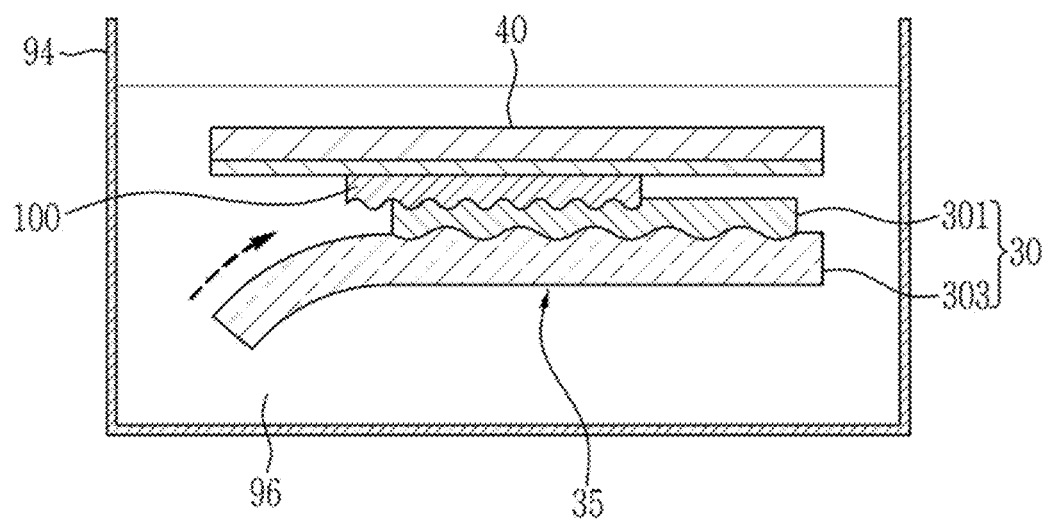

Returning to FIG. 2, in the step S80, the PET/EVA/WGr/PSS/PS stack 30 is immersed in water for removing the PSS/PS substrate 30 as shown in FIG. 10. To this end, a water tank 94 containing water 96 is prepared. The PSS 301 is water soluble. Therefore, if the PSS/PS substrate 30, the wrinkled graphene 100, and the EVA/PET substrate 40 are immersed in the water 96, the PSS 301 is dissolved in the water 96 and the polystyrene PS substrate 303 is also automatically separated from the wrinkled graphene 100. In this way, by using the PSS 301 as a sacrificial layer, the wrinkled graphene 100 can be manufactured in a simple and environment-friendly process without contamination.

Figure 11:
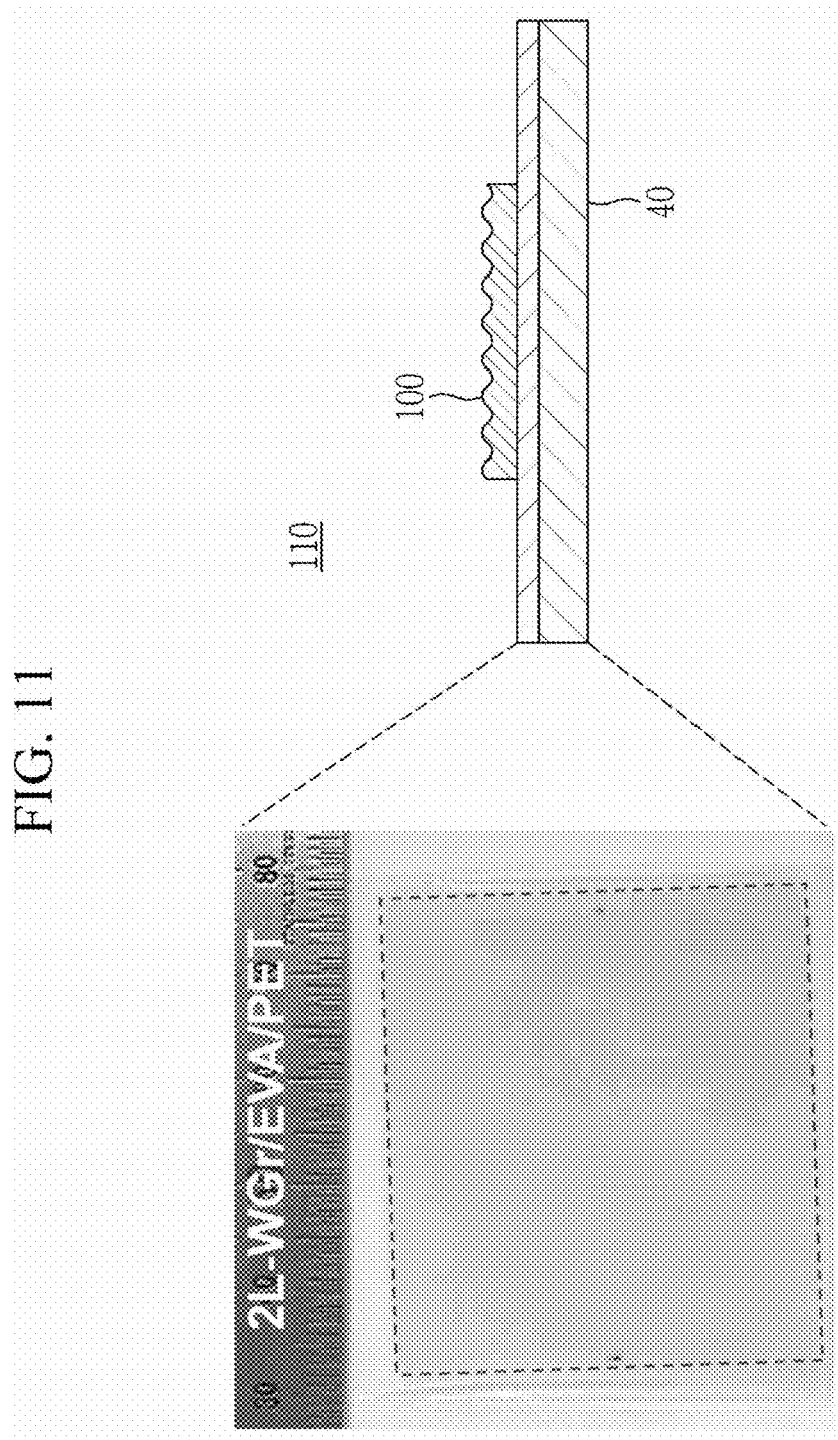

Finally, in the step S90, the wrinkled graphene 100 attached to the EVA/PET substrate 40 is provided as shown in FIG. 11. On the left side of FIG. 11, a planar enlarged photograph of the wrinkled graphene 100 and the EVA/PET substrate 40 is shown. FIG. 11 shows a stacking state of two wrinkled graphenes 100 as an example. Since the PSS/PS substrate 30 is cleanly removed by washing with water in FIG. 10, the wrinkled graphene 100 attached to the EVA/PET substrate 40 can be manufactured. Therefore, it is possible to obtain wrinkled graphene of a large area that is transferred cleanly without damage on the polymer substrate.

Figure 12:
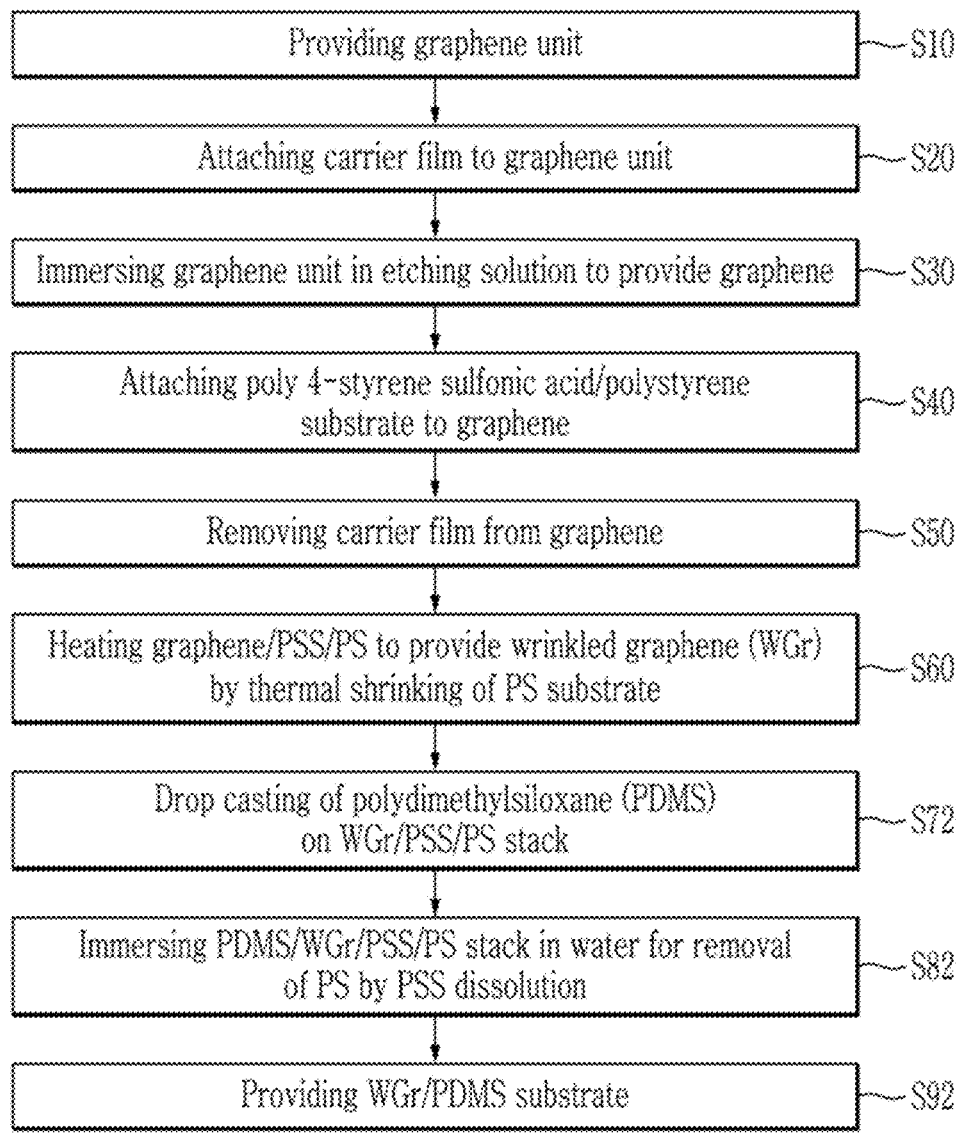
FIG. 12 is a schematic flowchart of a method for manufacturing a large-area wrinkled graphene substrate according to a second embodiment of the present invention.

FIG. 12 is a schematic flowchart of a method for manufacturing a large-area wrinkled graphene substrate according to a second embodiment of the present invention. Steps S10 to S60 of FIG. 12 are the same as steps S10 to S60 of the method for manufacturing a large-area wrinkled graphene substrate according to the first embodiment of the present invention of FIG. 2, detailed description thereof is omitted.

Hereinafter, only the steps S72 to S92, which are different from those according to the first embodiment of the present invention will be described.

With regard to FIG. 12, FIGS. 13 to 15 schematically show partial steps of the method for manufacturing the large-area wrinkled graphene substrate of FIG. 12. Hereinafter, each step of FIG. 12 will be described with reference to FIGS. 13 to 15.

Figure 13:
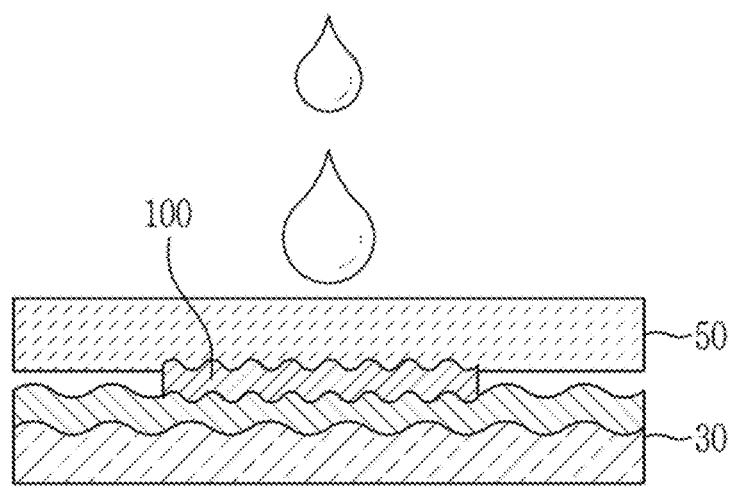
FIGS. 13 to 15 are views schematically showing partial steps of the method of manufacturing the large-area wrinkled graphene substrate of FIG. 12.
Figure 14:
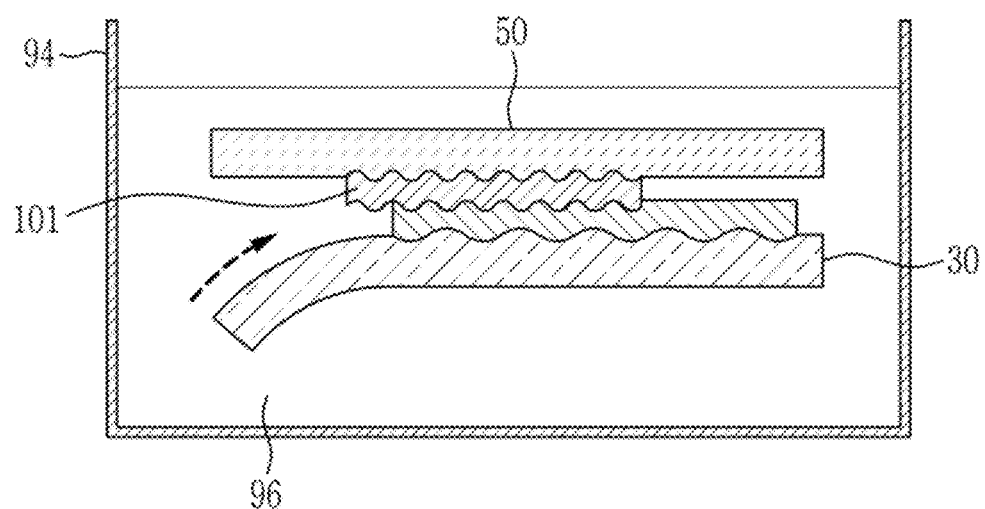

First, in the step S72 of FIG. 12, the PDMS substrate 50 is transferred by coating polydimethylsiloxane (PDMS) on the wrinkled graphene 100 as shown in FIG. 13. That is, the PDMS substrate 50 is manufactured by a method such as drop casting. The liquid PDMS penetrates between the wrinkled microstructures of the wrinkled graphene 100 to form a contact area that is maximally extended. Through this, it is possible to manufacture the wrinkled graphene substrate 120 having strong interfacial properties. On the other hand, depending on the purpose of use of the wrinkled graphene 100, instead of the PDMS substrate 50, a wrinkled graphene substrate may be manufactured by using various functional polymer materials Next, returning to FIG. 12, in step S82, the PDMS/WGr/PSS/PS substrate 30 is immersed in water for removing the PSS/PS substrate 30 as shown in FIG. 14. Since the rest process except using the PDMS substrate 50 in FIG. 14 is same as the step S80 of FIG. 10, a detailed description thereof will be omitted.

Figure 15:
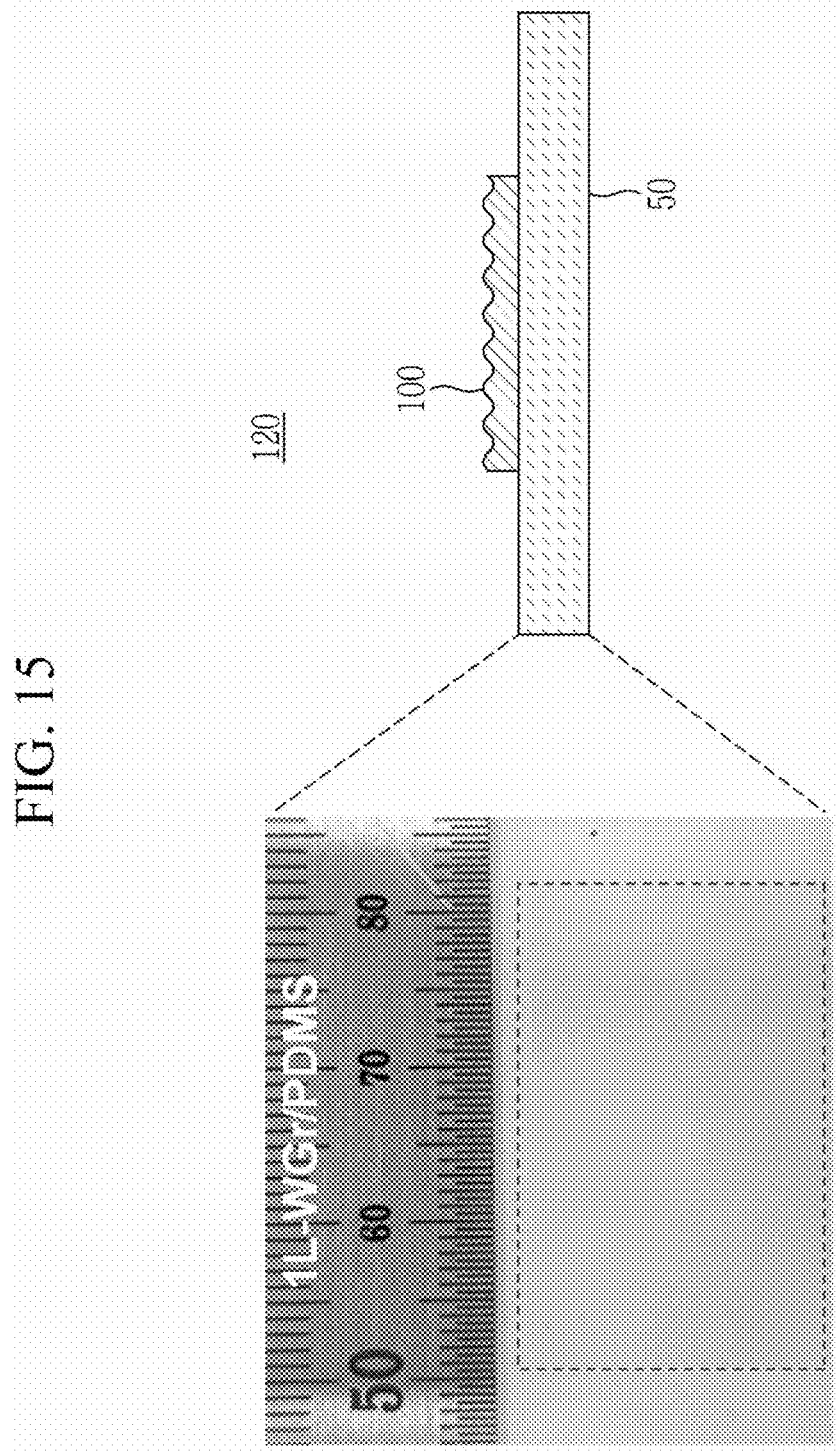

Finally, in the step S92 of FIG. 12, the wrinkled graphene substrate 120, which is manufactured by transferring the wrinkled graphene 100 on the PDMS substrate 50, is provided as shown in FIG. 15. On the left side of FIG. 15, a planar enlarged photograph of the wrinkled graphene substrate 120 is shown. FIG. 15 shows a state of stacking one wrinkled graphene 100 as an example. In FIG. 14, the PSS/PS substrate 30 is cleanly removed by washing with water to prepare a wrinkled graphene substrate 120 in a complete form. Therefore, it is possible to obtain a large-area wrinkled graphene substrate 120 that is transferred cleanly without damage.

EXPERIMENTAL EXAMPLES

Hereinafter, the present invention will be described in detail through experimental examples. These experimental examples are only for illustrating the present invention, and the present invention is not limited thereto.

Experimental Example 1

Commercial Feasibility Test of Large-Area Wrinkled Graphene Substrates

An experiment was conducted on whether wrinkled graphene substrates can be manufactured in large-area. In particular, when the wrinkled graphene is transferred from the PSS/PS substrate to the EVA/PET substrate, it was the most important whether the structure can be maintained as it is. Therefore, it was tested whether the structure of wrinkled graphene is maintained before and after the transfer onto a target polymeric substrate. The detailed description of such an experiment will be omitted because a person skilled in the art can easily understand it from the above description.

Comparative Measurement Experiment of Surface and Interface Structures of Wrinkled Graphene Before and After Transfer To observe whether the prepared wrinkled graphene maintains its surface structure even after transfer, the surface structure of wrinkled graphene before and after transfer is compared to be measured by using a scanning electron microscope. First, wrinkled graphene was prepared according to the manufacturing method of the wrinkled graphene substrate of FIG. 2. The steps S40 and S50 of FIG. 2 were repeated twice to prepare a wrinkled graphene substrate stacked in two layers. The horizontal and vertical lengths of the prepared wrinkled graphene substrates were 6 cm, respectively.

Figure 16A:
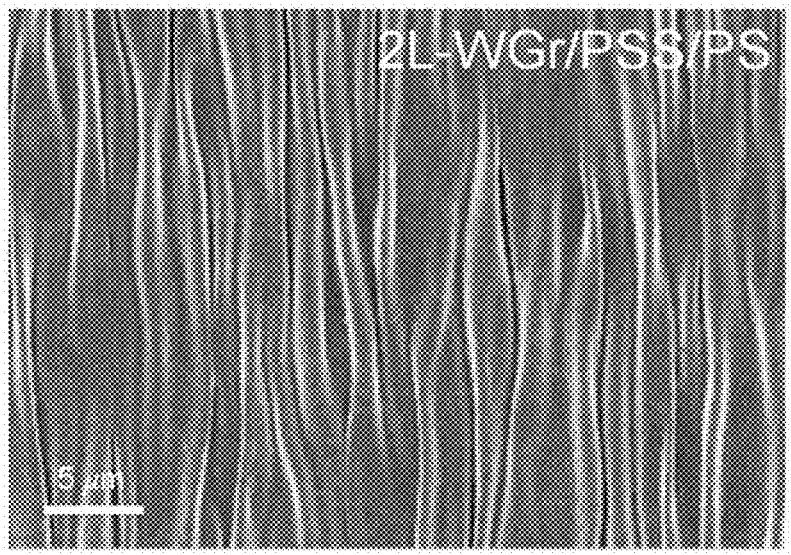
FIGS. 16A, 16B, 17A, 17B, 18A, 18B, 19A, 19B, and 20 are graphs showing experimental results of wrinkled graphene before and after transfer according to Experimental Example 1 of the present invention.
Figure 16B:
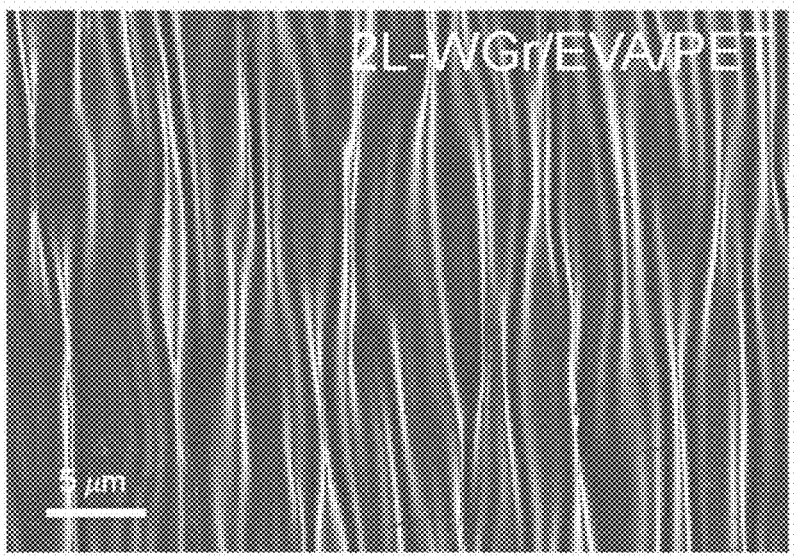

Comparative Measurement Experiment of Surface Structure of Wrinkled Graphene Before and After Transfer FIG. 16 is scanning electron microscope images of the surface before and after transfer of wrinkled graphene according to an experimental example of the present invention. More specifically, FIG. 16A is a scanning electron microscope image of wrinkled graphene to which a PSS/PS substrate is attached, before transfer, that is, immediately after preparing wrinkled graphene by heat shrinkage while FIG. 16B is a scanning electron microscope image of the surface of wrinkled graphene after transfer, that is, after removing the PSS/PS substrate and attaching the EVA/PET substrate.

In FIGS. 16A and 16B, white portions are wrinkles while black portions are areas between wrinkles. As shown in FIGS. 16A and 16B, it was found that the structure of the wrinkled graphene was maintained before and after the transfer. That is, through the process of removing the PSS/PS substrate and attaching the EVA/PET substrate in the experimental example of the present invention, it was possible to maintain the wrinkled graphene formed by heat shrinkage as it is.

Figure 17A:
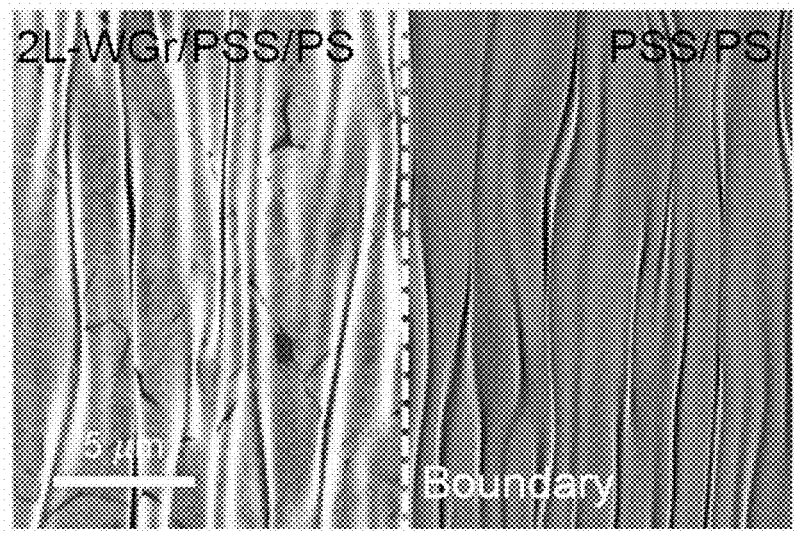

Comparative Measurement Experiment of the Structure of the Wrinkled Graphene Interface Before and After Transfer FIG. 17 is scanning electron microscope images showing the structure of the interface between the wrinkled graphene and the substrate before and after the transfer of the wrinkled graphene substrate according to Experimental Example 1 of the present invention. More specifically, FIG. 17A shows a state before transfer, that is, the boundary between a region with wrinkled graphene and a region with only a PSS/PS substrate without wrinkled graphene immediately after preparing wrinkled graphene by thermal shrinkage. The left side of FIG. 17A is a surface scanning electron micrograph of wrinkled graphene, and the right side of FIG. 17A is a surface scanning electron micrograph of the PSS/PS substrate located therebelow. As shown in FIG. 17A, it was confirmed that the structure of the wrinkled graphene exactly corresponds to the wrinkled structure generated on the PSS/PS substrate surface. Through this, the graphene and the PSS/PS substrate were firmly adhered without sliding during the wrinkled graphene manufacturing process through heat shrinkage, which meant that the structure of the wrinkled structure generated in the graphene could be controlled.

Figure 17B:
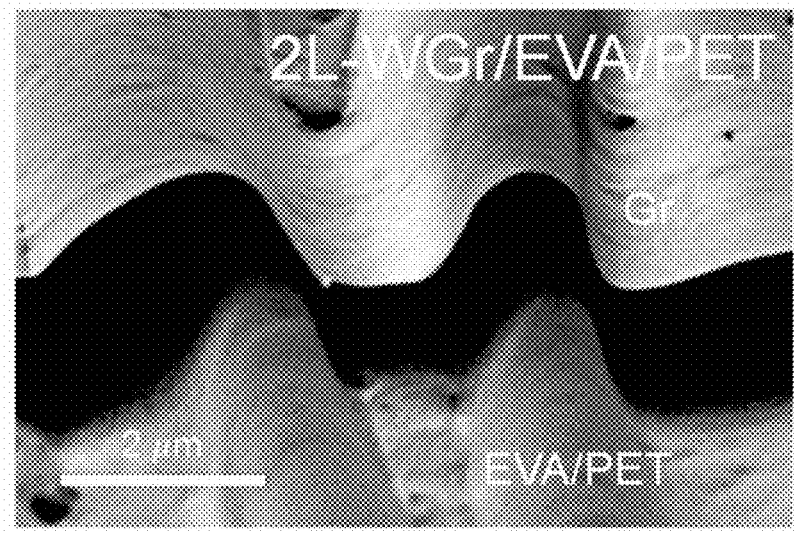

On the other hand, FIG. 17B is a scanning electron microscope measured after transfer, that is, after removing the PSS/PS substrate and cutting the wrinkled graphene to which the EVA/PET substrate is attached using a focused ion beam. The scanning electron micrograph shows that wrinkled graphene is firmly attached to the EVA substrate without debonded regions. That is, it shows that the structure of the wrinkled graphene is well-preserved without loss even after the wrinkled graphene is transferred from the PSS/PS substrate to the EVA/PET substrate due to the robust interfacial adhesion properties.

Figure 18A:
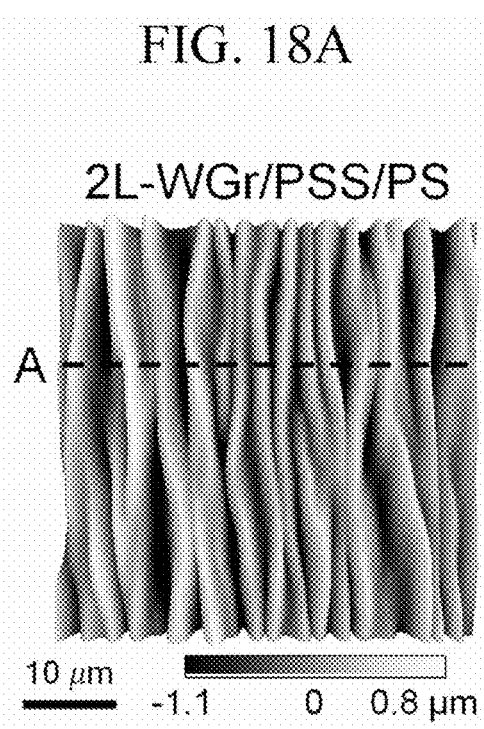
Figure 18B:
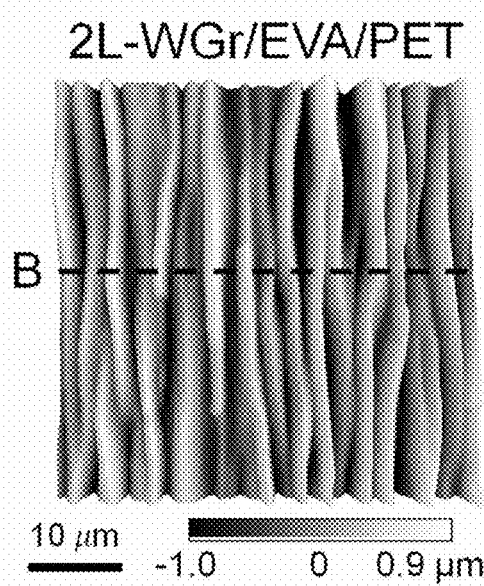

Comparative Measurement Experiment of Wrinkled Graphene Structure Before and After Transfer FIGS. 18A and 18B are atomic force microscope (AFM) images measuring the surface roughness of wrinkles before and after transfer of the two-layer wrinkled graphene substrate according to Experimental Example 1 of the present invention, respectively. More specifically, FIG. 18A shows a result of three-dimensional measurement of the surface structure of wrinkled graphene attached to the PSS/PS substrate before transfer, and FIG. 18B shows a result of three-dimensional measurement of the surface structure of the wrinkled graphene attached to the EVA/PET substrate after transfer.

As shown in FIGS. 18A and 18B, it was confirmed that there was no significant change before and after transfer in the overall wrinkle structure. More specifically, the height change of the wrinkled graphene surface was measured along the dotted line shown in FIGS. 18A and 18B in order to confirm the change in the wrinkle structure before and after transfer.

Figure 19A:
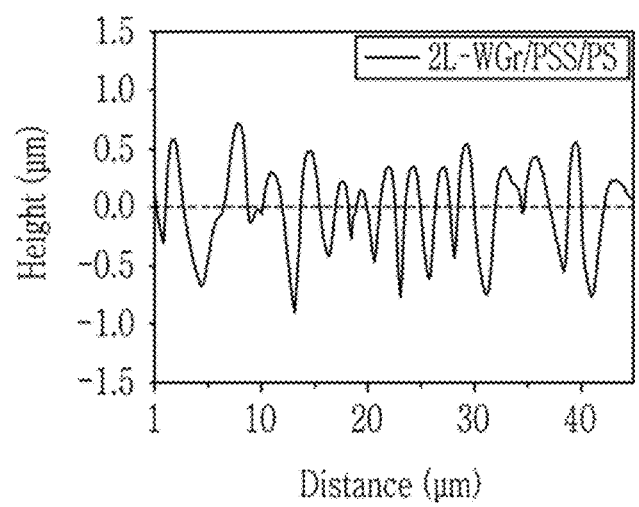
Figure 19B:
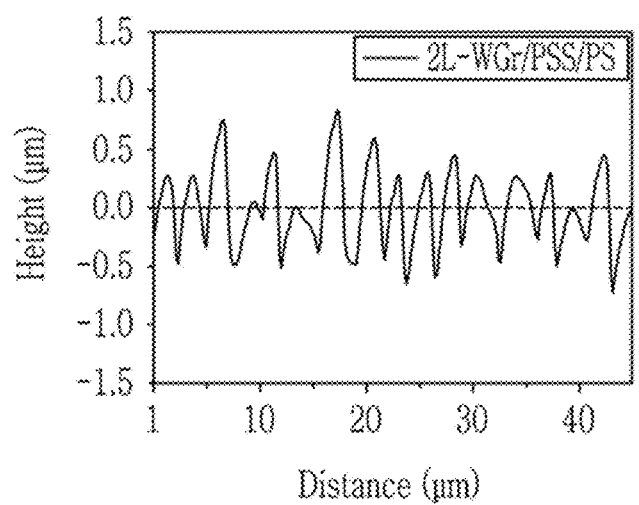

FIGS. 19A and 19B are graphs showing the height change of the wrinkled graphene surface along the dotted line shown in FIGS. 18A and 18B, respectively.

As shown in FIGS. 19A and 19B, it was confirmed that the graphene wrinkle structure had an average wavelength of 4 μm and an amplitude of 400 nm, and there was no significant change before and after transfer. For statistical analysis of the change in the wrinkled graphene structure before and after the transfer, 1-layer, 2-layer, 3-layer, and 4-layer wrinkled graphene substrates were fabricated using the method shown in FIG. 2, and after AFM measurement, the results were analyzed for power spectrum density.

Figure 20:
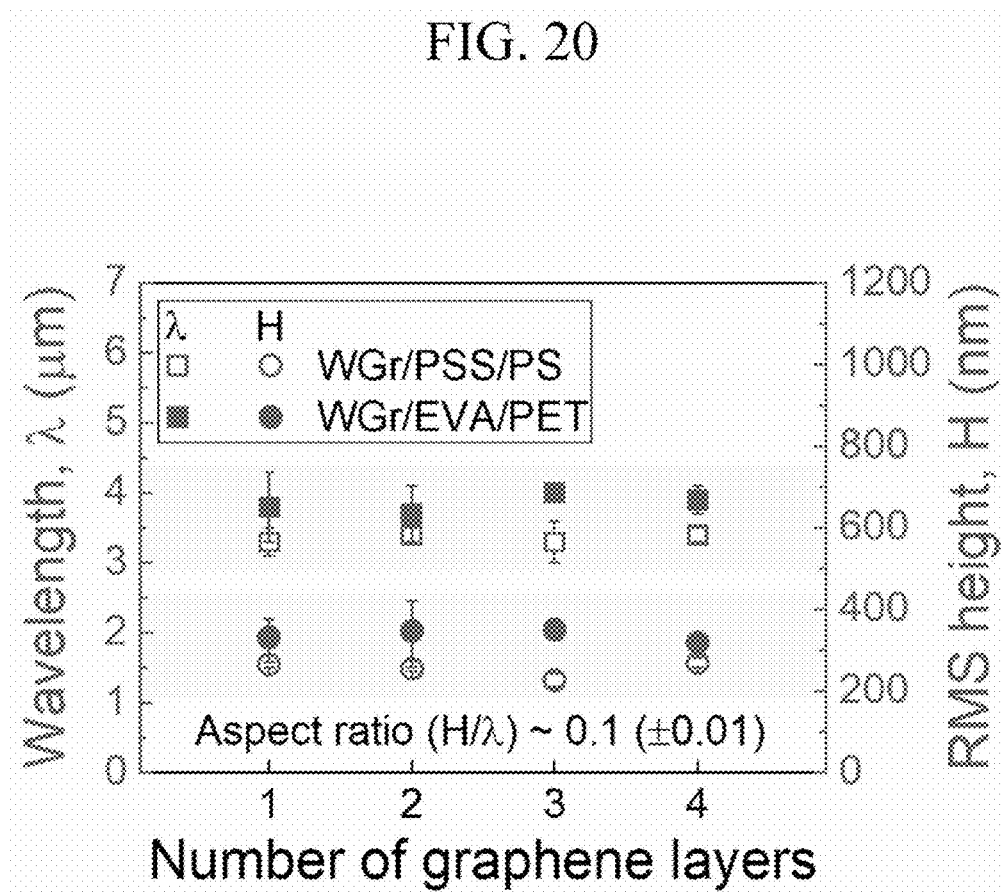

FIG. 20 is a graph showing the wavelength and RMS height (root-mean square) before and after transfer of 1-layer, 2-layer, 3-layer, and 4-layer wrinkled graphene substrates.

As shown in FIG. 20, the average wavelength of the wrinkled graphene attached to the PSS/PS substrate before transfer was 3.5 μm, and the RMS height corresponding to the average amplitude of the wrinkles was 260 nm, and had a constant wrinkled structure regardless of the number of layers. Considering the fact that the wrinkle structure generated during the heat shrink process is determined by the thin film thickness, the thickness of the PSS layer in the PSS/PS substrate used in the heat shrink process is 750 nm, which is much larger than the thickness of the monolayer graphene layer, which is about 0.335 nm. The wrinkle structures produced in the graph were all similar regardless of the number of graphene layers. For reference, the average thickness of the 4-layer graphene was 1.34 nm. As for the wrinkled graphene attached to EVA/PET after transfer, the change in the wrinkled structure according to the number of layers could be neglected as before transfer. The average wavelength was slightly increased to 3.9 μm, and the RMS height was also slightly increased to 300 nm. Although there was a slight change in the wrinkle structure after transfer, the extent was insignificant, so it can be judged that the graphene wrinkle structure generated before transfer is maintained almost as it is after transfer. From these results, it could be confirmed that the wrinkled graphene substrate manufactured through the method of FIG. 2 almost maintained the wrinkled structure even after transfer regardless of the number of layers.

Experimental Example 2

Test on the Suitability of a Transparent Electrode of Wrinkled Graphene Substrate The wrinkled graphene substrate prepared by the method of FIG. 2 was tested whether it was suitable for use as a transparent electrode. In order to be used as a transparent electrode, the wrinkled graphene substrate should have excellent optical transmittance and low sheet resistance. Therefore, experiments were mainly conducted on these two properties. More specifically, optical transmittance and sheet resistance were measured according to the number of layers of wrinkled graphene. That is, steps S40 and S50 of FIG. 2 are repeated once, twice, three times, and four times to prepare wrinkled graphene having a one-layer, two-layer, three-layer, and four-layer, respectively and then an experiment was conducted. The detailed description of such an experiment will be omitted because a person skilled in the art can easily understand it from the above description.

Figure 21:
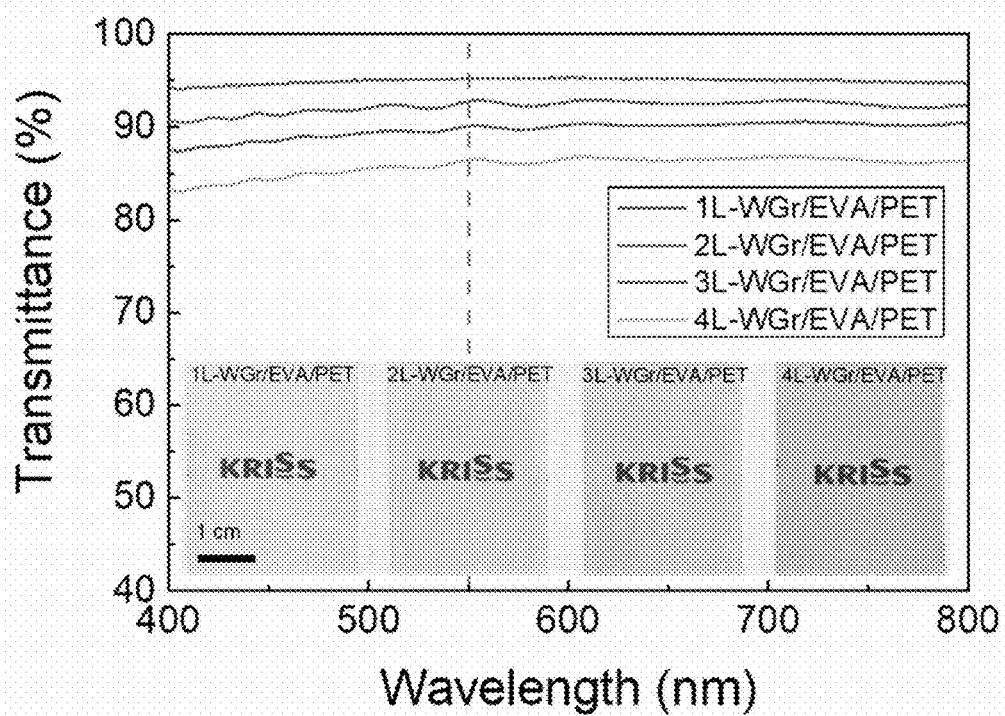
FIGS. 21 to 25, 26A, and 26B are graphs showing the experimental results of wrinkled graphene in which the number of layers was varied according to Experimental Example 2 of the present invention.

Optical Transmittance Measurement Experiment According to the Number of Stacks of Wrinkled Graphene FIG. 21 shows the experimental results of optical transmittance according to the number of stacks of wrinkled graphene according to Experimental Example 2 of the present invention. As shown in FIG. 21, it can be seen that the color of the wrinkled graphene substrate gradually darkens as the number of stacked layers of wrinkled graphene attached to the EVA/PET substrate increases to 1, 2, 3, and 4 layers. This can also be confirmed by placing a wrinkled graphene substrate on paper with KRISS (Korea Institute of Standards and Science) printed on it. That is, it was confirmed that the wrinkled graphene substrate was transparent to some extent and had a optical transmittance sufficient to see the letters located on the back side. In particular, as the number of layers of wrinkled graphene increased, the optical transmittance gradually decreased to 95%, 93%, 90%, and 86% at the 550 nm excitation laser wavelength. As the excitation laser wavelength increased, the optical transmittance showed a tendency to slightly increase, but the optical transmittance was almost constant above 550 nm as shown in dotted line.

Experiment for Measuring the Relationship Between Optical Transmittance and Sheet Resistance According to the Number of Layers of Wrinkled Graphene The relationship between sheet resistance and optical transmittance of wrinkled graphene of which the number of layers was 1 layer, 2 layers, 3 layers, and 4 layers was analyzed.

Figure 22:
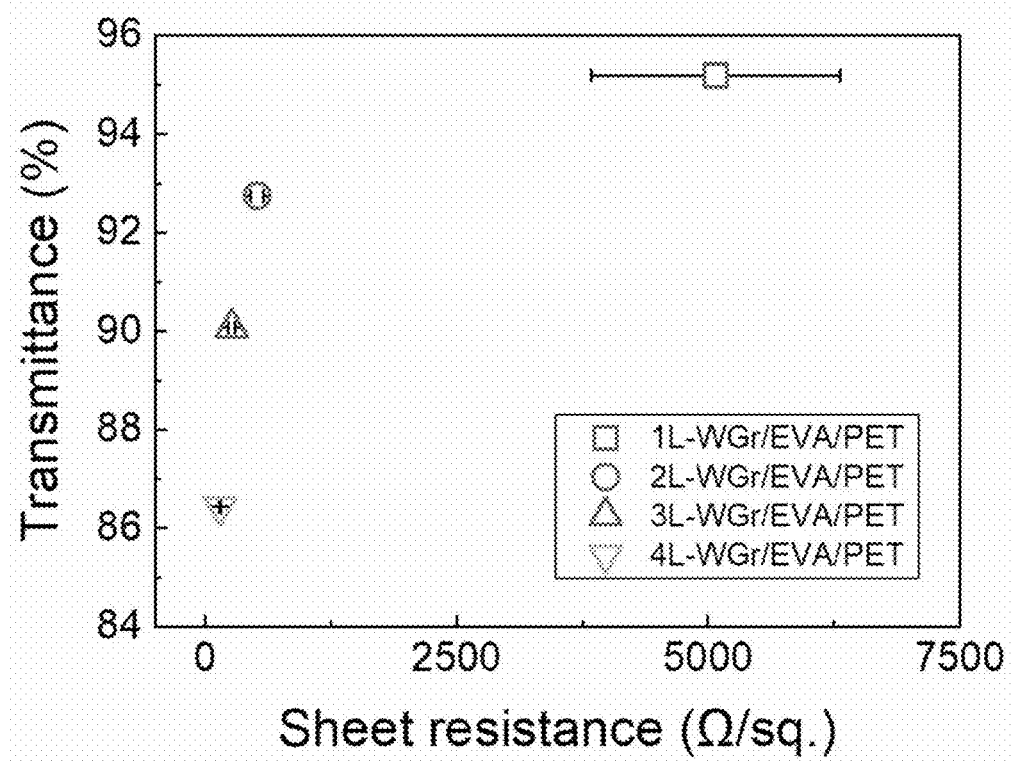

FIG. 22 shows the measurement results of sheet resistance and optical transmittance according to the number of stacks of wrinkled graphene according to Experimental Example 2 of the present invention. In FIG. 22, the number of stacks of wrinkled graphene attached to the EVA/PET substrate is indicated by □ as 1 layer, ○ as 2 layers, Δ as 3 layers, and ∇ as 4 layers, respectively.

As shown in FIG. 22, the 1 layer of the wrinkled graphene had an average sheet resistance of 5073Ω/□, and 4000Ω/□ to 6000Ω/□ of the sheet resistance which is widely distributed. On the other hand, in wrinkled graphene with two or more layers, consistent values were measured with almost no distribution in the measured values of sheet resistance, and the average sheet resistance for 2-layer, 3-layer and 4-layer wrinkled graphene was 516 Ω/□, 264Ω/□, and 146Ω/□, respectively. The optical transmittance was about 95%, 93%, 90%, and 86% of the wrinkled graphene of the 1, 2, 3 and 4 layers at 550 nm excitation laser wavelength, respectively. Since the field of application of the transparent electrode made of various materials is determined by its sheet resistance and optical transmittance, this can be confirmed in FIG. 23. Hereinafter, this will be explained with reference to FIG. 23.

Figure 23:
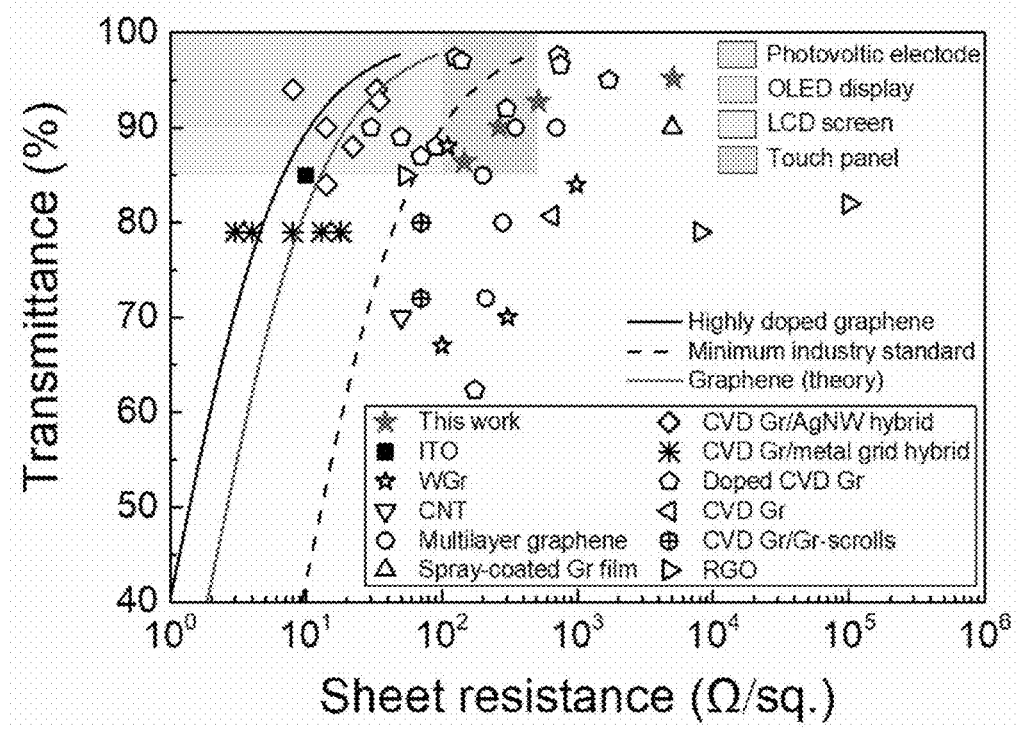

FIG. 23 is a graph showing a measurement result of the sheet resistance and optical transmittance of various transparent electrode materials at 500 nm excitation laser wavelength. In Experimental Example 2 of FIG. 23, the wrinkled graphene substrates have 1 to 4 layers, respectively from right to left, indicated by ☆ (This work). FIG. 23 shows the optical transmittance and sheet resistance ranges of a transparent electrode suitable for use as photovoltaic electrodes, OLED displays, LCD displays, and touch panels, and the theoretical value of graphene and the maximum values obtainable through doping are also displayed.

As shown in FIG. 23, the wrinkled graphene substrate prepared according to Experimental Example 2 of the present invention laminated in 2 layers, 3 layers, and 4 layers belonged to the touch panel and LCD panel area. Therefore, it was found that the wrinkled graphene substrate is suitable for use as a transparent electrode for touch panels and LCD panels in consideration of sheet resistance and optical transmittance. However, it was found that the wrinkled graphene substrate laminated in one layer had a large sheet resistance, so it was not suitable for use as an electrode for a touch panel, located outside the touch panel area. This is because in the case of the single-layer wrinkled graphene substrate prepared in Experimental Example 2, the tensile load in the other direction constrained as thermal contraction occurred in only one direction during the thermal contraction process of the graphene/PSS/PS substrate in order to generate a one-dimensional wrinkled structure. This is due to the occurrence of cracks in the wrinkled graphene. In the case of making a two-dimensional wrinkled structure, since there is no need for restraint during the thermal shrinkage process of the graphene/PSS/PS substrate, it is expected that damage caused by cracks occurring in wrinkled graphene can be prevented. In this case, the single-layer wrinkled graphene substrate also has a low sheet resistance and can be used as a transparent electrode.

Experimental Example 3

Experiment on Suitability of Flexible Transparent Electrode of Wrinkled Graphene Substrate In Experimental Example 2 above, the suitability of transparent electrode of wrinkled graphene substrate produced from the viewpoint of optical transmittance and sheet resistance was evaluated. In Experimental Example 3, the ability to maintain electrical performance in a state of adding mechanical strain, which is a necessary requirement of a transparent electrode required in a flexible optoelectronic device, was evaluated. To this end, electro-mechanical properties and durability tests were performed on the wrinkled graphene substrate produced as shown in FIG. 2. That is, the electrical resistance change behavior according to the change in strain of the wrinkled graphene substrate, stretchability, and durability according to fatigue deformation were measured. The detailed description of the experiment will be omitted because a person skilled in the art can easily understand it from the above description.

Electro-Mechanical Properties Comparison Measurement Experiment of Wrinkled Graphene Substrate and Planar Graphene Substrate The electro-mechanical properties of the wrinkled graphene substrate (wrinkled graphene/EVA/PET substrate) prepared according to FIG. 2 were measured. More specifically, the electrical resistance change occurring in the wrinkled graphene was measured while mechanical strain was applied to the wrinkled graphene substrate stacked with 1 layer, 2 layers, 3 layers, and 4 layers. In addition, planar graphene/PET substrates were prepared by transferring planar graphene without a wrinkled structure onto the same PET substrate, and the electro-mechanical properties of the wrinkled graphene substrate were compared and analyzed. The measurement result is shown in FIG. 24.

Figure 24:
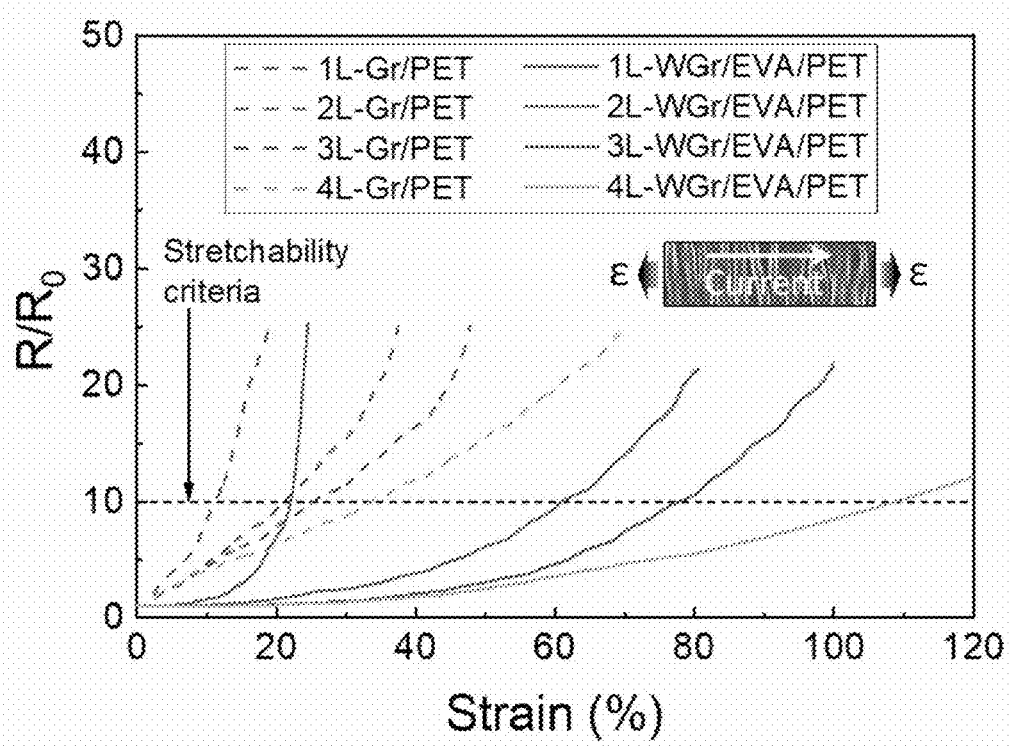

FIG. 24 is a graph measuring electrical resistance change according to elongation of a wrinkled graphene substrate (wrinkled graphene/EVA/PET substrate) and a graphene substrate without a wrinkled structure (planar graphene/PET substrate).

As shown in FIG. 24, as the strain of the planar graphene substrate indicated by the dotted line and the wrinkled graphene substrate indicated by the solid line increased, the electrical resistance thereof increased. In addition, as the number of graphene stacks increased, the increase in electrical resistance according to strain was slowed. However, in the case of the planar graphene substrate, the electrical resistance increased rapidly as the strain increased compared to the wrinkled graphene substrate. These results mean that the wrinkled graphene substrate has superior electro-mechanical properties compared to the planar graphene substrate. That is, it means that the ability to maintain electrical performance with respect to deformation is excellent, and it shows that it is suitable for use as a flexible transparent electrode requiring low electrical performance degradation (low electrical resistance increase) with respect to deformation. The wrinkled graphene substrate accommodates the added strain while the resulting wrinkled structure is stretched. Therefore, it is possible to accommodate high strain without damage to graphene, which can have excellent electro-mechanical properties.

In order to more quantitatively evaluate the electro-mechanical properties of the wrinkled graphene substrate, the strain value at the point where the electrical resistance increases 10 times compared to the initial electrical resistance was defined as the stretchability of the wrinkled graphene substrate, and the result was compared with the result of the planar graphene substrate. Here, the stretchability of the substrate means the strain value at the point where the horizontal dotted line intersects each experimental data in FIG. 24. This will be described in more detail with reference to FIG. 25.

Figure 25:
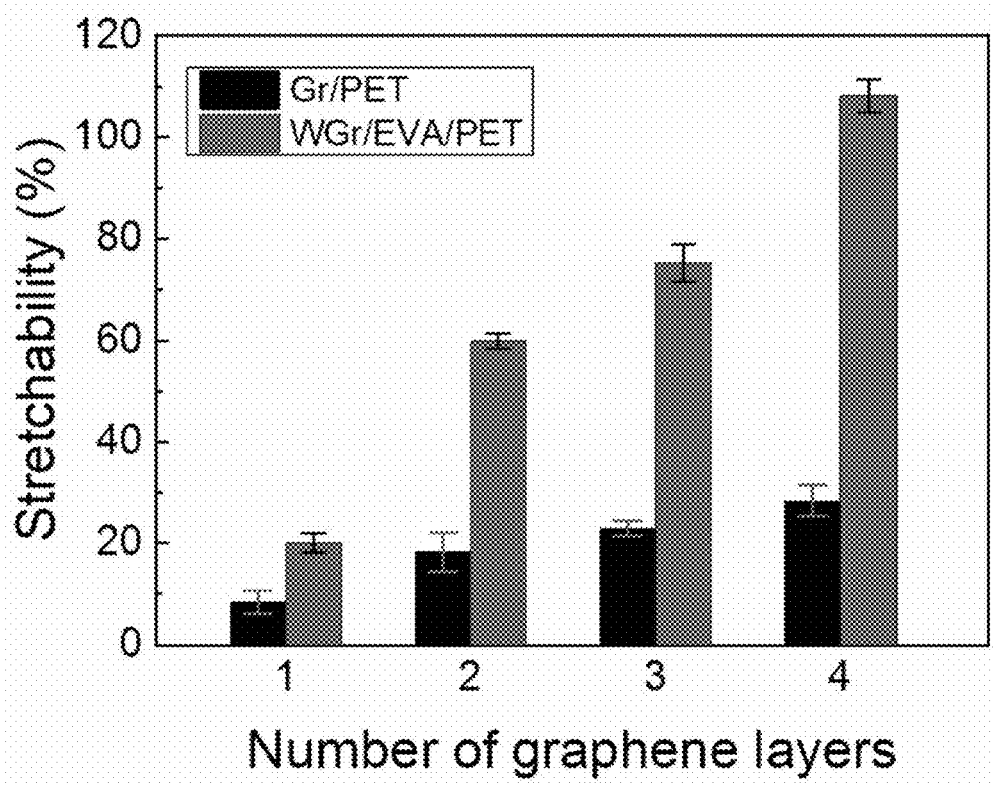

FIG. 25 is a graph measuring the change in stretchability according to the number of layers of a wrinkled graphene substrate (wrinkled graphene/EVA/PET substrate) and a graphene substrate without a wrinkled structure (planar graphene/PET substrate).

As shown in FIG. 25, in the case of the wrinkled graphene substrate, it exhibited more than three times the stretchability of the planer graphene substrate regardless of the number of layers. The stretchability of the 1-layer, 2-layer, 3-layer and 4-layer wrinkled graphene substrates was 20%, 60%, 75%, and 110%, respectively. These results indicate that the 1-layer, 2-layer, 3-layer, and 4-layer wrinkled graphene substrates work without significant degradation in electrical performance even at 20%, 60%, 75%, and 110% strains, respectively. Therefore, it was shown that the wrinkled graphene substrate is suitable as a flexible transparent electrode.

Figure 26A:
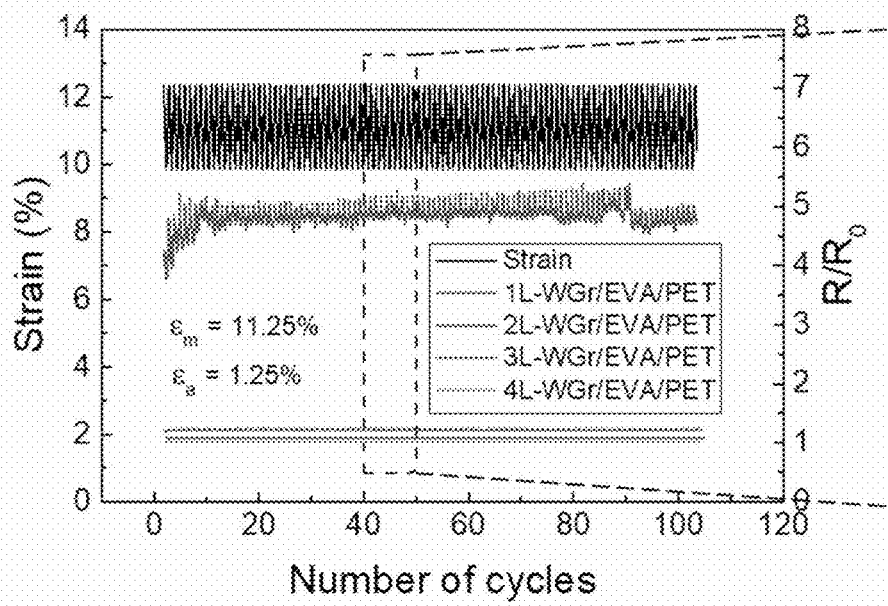
Figure 26B:
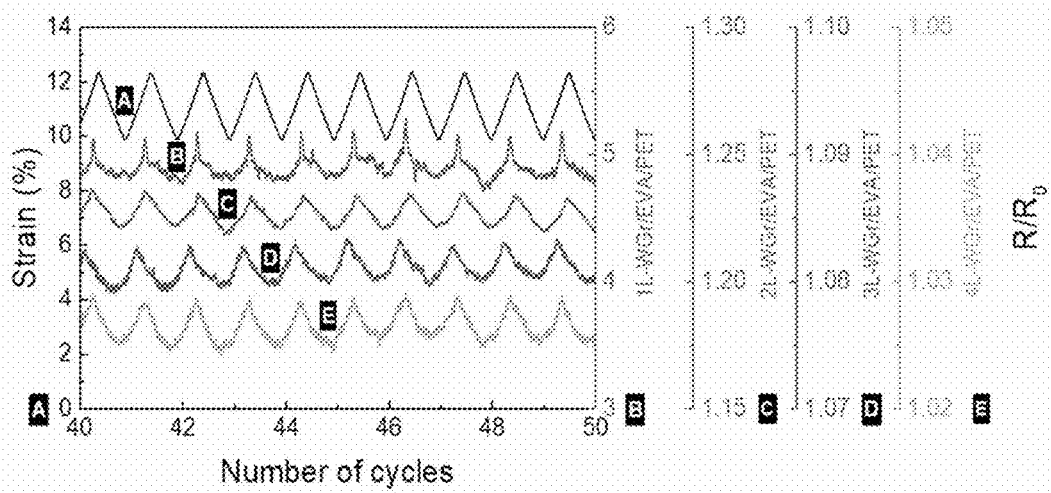

Durability Measurement Experiment Under Fatigue Deformation of Wrinkled Graphene Substrates FIG. 26 shows the change in electrical resistance when fatigue deformation with a a mean strain of 11.25% and strain amplitude of 1.25% is applied to the 1 layer, 2 layer, 3 layer, and 4 layer wrinkled graphene substrates. This is the result of measuring the electrical resistance change to fatigue deformation. More specifically, FIG. 26A shows the change in electro-mechanical properties of each of the wrinkled graphene/EVA/PET substrates of 1 layer, 2 layers, 3 layers, and 4 layers for a total of 105 fatigue deformation cycles, and FIG. 26B is an enlarged view of the 40-50 fatigue deformation cycle of FIG. 26A. The uppermost zigzag solid line A of FIG. 26B shows the strain waveform added to the wrinkled graphene substrate during fatigue deformation, and the electrical resistance change of the 1 layer B, 2 layer C, 3 layer D, and 4 layer E in the wrinkled graphene/EVA/PET substrate is sequentially presented below.

As shown in FIG. 26, the change in electrical resistance due to the fatigue deformation cycle was maintained almost constant up to 105 cycles for all of the wrinkled graphene EVA/PET substrates of the 1, 2, 3 and 4 layers. This means that the fabricated wrinkled graphene substrate can maintain constant electrical performance against fatigue deformation without loss and has excellent durability. In addition, the change in electrical resistance occurring in each fatigue deformation cycle gradually decreased from the 1 layer wrinkled graphene/EVA/PET substrate to the 4 layer wrinkled graphene/EVA/PET substrate. It was measured that the change in electrical resistance during fatigue deformation was insignificant in two or more layers of wrinkled graphene/EVA/PET substrate. These results mean that there is almost no change in electrical resistance when the wrinkled graphene substrate is fatigued. In addition, it means that the deterioration of electrical performance does not occur even during fatigue deformation. That is, it means that the prepared wrinkled graphene substrate has excellent durability.

Although the present invention has been described as described above, it will be readily understood by those skilled in the art to which the present invention pertains that various modifications and variations are possible without departing from the spirit and scope of the appended claims.

What is claimed is:

1. A method for manufacturing a wrinkled graphene on a polymeric substrate, comprising:
    providing a graphene unit;
    inserting a carrier film and the graphene unit between a pair of rolls and rotating the pair of rolls in opposite directions to attach the carrier film to the graphene unit;
    providing graphene by immersing the graphene unit in an etching solution;
    inserting the graphene and a poly (4-styrene sulfonic acid)/polystyrene (PSS/PS) substrate between the pair of rolls and attaching the graphene to the PSS/PS substrate, the PSS/PS substrate comprising a PSS substrate and a PS substrate;
    removing the carrier film from the graphene to provide a graphene/PSS/PS stack;
    heating the graphene/PSS/PS stack wherein the PS substrate is shrunken to generate a wrinkled graphene (WGr);
    inserting a polymeric substrate, the WGr and the PSS/PS substrate between the pair of rolls, and attaching the polymeric substrate onto the WGr by rotating the pair of rolls in opposite directions to form a polymeric substrate/WGr/PSS/PS substrate;
    immersing the polymeric substrate/WGr/PSS/PS substrate in water to remove the PS substrate by dissolving the PSS substrate, and
    providing a wrinkled graphene substrate on the polymeric substrate.

2. The method of claim 1, wherein in the providing the graphene unit, the graphene unit comprises:
    a first graphene layer,
    a copper thin film located on the first graphene layer, and
    a second graphene layer located on the copper thin film; and
    wherein the first and the second graphene layers are grown by using a chemical vapor deposition method on the copper thin film, the copper thin film acting as a catalyst.

3. The method of claim 1,
    further comprising repeating the attaching the graphene to a PSS/PS substrate and the removing a carrier film from the graphene before generating the wrinkled graphene, and
    wherein the graphene is laminated in multiple layers.

4. The method of claim 3, wherein the attaching the graphene to a PSS/PS substrate and the removing a carrier film from the graphene are repeated 2 to 4 times.

5. The method of claim 3, wherein the graphene is stacked in two to four layers.

6. The method of claim 1, wherein in providing the graphene, the etching solution comprises:
    in one liter of deionized water, ammonium persulfate (APS) of greater than 0 and not more than 0.1 M;
    imidazole of 1 mM to 10 mM; and
    50 mM sulfuric acid.

7. The method of claim 1, wherein in attaching the graphene onto the PSS/PS substrate, the PSS/PS substrate comprises:
    a PSS substrate attached below the graphene; and
    a PS substrate attached below the PSS substrate; and
    wherein the PSS substrate is dissolved in the water and the PS substrate is automatically separated from the graphene in immersing the PSS/PS substrate in the water to remove the PS substrate.

8. The method of claim 1, wherein the PSS/PS substrate is compressed by the pair of rolls and is attached to the graphene in attaching the graphene to the PSS/PS substrate.

9. The method of claim 1, wherein an amount of heat shrinkage of the PS substrate is 10% to 900%.

10. The method of claim 1, wherein the attaching the graphene to the PSS/PS substrate is performed at 80° C. to 120° C.

11. The method of claim 1, wherein a heating temperature of the graphene/PSS/PS stack is not less than a glass transition temperature of polystyrene in the polystyrene substrate.

12. The method of claim 1, wherein a heating temperature of the graphene/PSS/PS stack is 120° C. to 150° C. in generating the wrinkled graphene.

13. The method of claim 1, wherein the carrier film is manufactured by coating silicone on a polyethylene terephthalate substrate.

14. The method of claim 1, wherein the inserting the carrier film and the graphene unit between a pair of rolls is performed at 20° C. to 30° C.

15. The method of claim 1, wherein the polymeric substrate comprises at least one material selected from a group consisting of ethylene vinyl acetate/polyethylene terephthalate (EVA/PET), polyimide and ecoflex.

16. The method of claim 15, wherein in forming the polymeric substrate/WGr/PSS/PS substrate, the EVA/PET is melted to be compressed onto the wrinkled graphene at 85° C. to 120° C.

* * * * *